US012426352B2

(12) United States Patent
Mitsuzuka et al.

(10) Patent No.: US 12,426,352 B2
(45) Date of Patent: Sep. 23, 2025

(54) SEMICONDUCTOR DEVICE AND METHOD FOR FABRICATING SEMICONDUCTOR DEVICE

(71) Applicant: FUJI ELECTRIC CO., LTD., Kanagawa (JP)

(72) Inventors: Kaname Mitsuzuka, Matsumoto (JP); Yuichi Onozawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 18/507,125

(22) Filed: Nov. 13, 2023

(65) Prior Publication Data

US 2024/0079406 A1 Mar. 7, 2024

Related U.S. Application Data

(62) Division of application No. 17/133,692, filed on Dec. 24, 2020, now Pat. No. 11,830,871.

(30) Foreign Application Priority Data

Feb. 21, 2020 (JP) .................................. 2020-028468

(51) Int. Cl.
*H10D 84/60* (2025.01)
*H01L 23/34* (2006.01)
(Continued)

(52) U.S. Cl.
CPC ........... *H10D 84/617* (2025.01); *H01L 23/34* (2013.01); *H10D 8/022* (2025.01); *H10D 8/25* (2025.01);
(Continued)

(58) Field of Classification Search
CPC ............. H01L 27/0664; H01L 27/0629; H01L 27/0716; H01L 29/1095; H01L 29/66106;
(Continued)

(56) References Cited

U.S. PATENT DOCUMENTS 6,188,109 B1   2/2001   Takahashi
6,538,289 B1   3/2003   Topp
(Continued)

FOREIGN PATENT DOCUMENTS

JP    H11154746 A    6/1999
JP    2002517116 A    6/2002
(Continued)

OTHER PUBLICATIONS

Office Action issued for counterpart Japanese Application No. 2020-028468, transmitted from the Japanese Patent Office on Nov. 28, 2023 (drafted on Nov. 20, 2023).

(Continued)

*Primary Examiner* — Natalia A Gondarenko

(57) ABSTRACT

Provided is a semiconductor device including a semiconductor substrate; a transistor portion provided in the semiconductor substrate; a current sensing portion for detecting current flowing through the transistor portion; an emitter electrode set to an emitter potential of the transistor portion; a sense electrode electrically connected to the current sensing portion; and a Zener diode electrically connected between the emitter electrode and the sense electrode. Provided is a semiconductor device fabricating method including providing a transistor portion in a semiconductor substrate; providing a current sensing portion for detecting current flowing through the transistor portion; providing an emitter electrode set to an emitter potential of the transistor portion; providing a sense electrode electrically connected to the current sensing portion; and providing a Zener diode electrically connected between the emitter electrode and the sense electrode.

11 Claims, 16 Drawing Sheets

(51) Int. Cl.
*H10D 8/01* (2025.01)
*H10D 8/25* (2025.01)
*H10D 12/00* (2025.01)
*H10D 12/01* (2025.01)
*H10D 62/17* (2025.01)

(52) U.S. Cl.
CPC ......... *H10D 12/032* (2025.01); *H10D 12/441* (2025.01); *H10D 62/393* (2025.01)

(58) Field of Classification Search
CPC ......... H01L 29/66136; H01L 29/66333; H01L 29/7395; H01L 29/866; H01L 29/0696; H01L 29/6634; H01L 29/0834; H01L 22/32; H01L 21/8232; H01L 29/739816; H01L 29/417; H01L 29/407; H01L 29/4238; H01L 29/7397; H01L 29/861; H01L 29/732; H01L 29/7325; H01L 29/7391; H01L 29/7393; H01L 29/7396; H01L 29/0839; H01L 23/34; H01L 23/473; H01L 23/495; H01L 24/42–49; H01L 2224/42; H01L 2224/49505; H01L 2224/49175; H01L 2225/06506; H01L 2225/0651; H01L 2225/1052; H01L 29/16; H01L 29/8613; H01L 29/8725; H01L 2924/13055; G01K 7/015; G01K 1/00; H10D 84/038; H10D 84/0123; H10D 84/617; H10D 84/811; H10D 8/022; H10D 8/25; H10D 8/422; H10D 12/032; H10D 12/035; H10D 12/441; H10D 12/481; H10D 64/117; H10D 64/232; H10D 64/519; H10D 62/142; H10D 62/83; H10D 62/127; H10D 62/393; H10D 12/411–491; H10D 12/01; H10D 12/031–038; H10D 62/141–148; H10D 62/152–155; H10D 62/156–159; H10D 84/40–409

USPC ...... 257/470, 109, 140, 678, 29.347, 29.166
See application file for complete search history.

(56) References Cited

U.S. PATENT DOCUMENTS

| | | | |
|---|---|---|---|
| 7,414,867 B2 * | 8/2008 | Hussein | H03K 17/567 |
| | | | 361/57 |
| 9,548,294 B2 | 1/2017 | Nishimura | |
| 10,290,625 B2 | 5/2019 | Sato | |
| 10,443,557 B2 | 10/2019 | Yamaguchi | |
| 2002/0088991 A1 * | 7/2002 | Hisamoto | H01L 29/7808 |
| | | | 257/106 |
| 2003/0146493 A1 | 8/2003 | Tomomatsu | |
| 2007/0126070 A1 | 6/2007 | Hotta | |
| 2011/0133246 A1 * | 6/2011 | Ueno | H10D 62/142 |
| | | | 257/140 |
| 2013/0256746 A1 | 10/2013 | Nakamura | |
| 2014/0070319 A1 | 3/2014 | Tonomura | |
| 2015/0171070 A1 | 6/2015 | Hanaoka | |
| 2015/0270387 A1 | 9/2015 | Kumada | |
| 2015/0294966 A1 | 10/2015 | Weyers | |
| 2016/0260707 A1 * | 9/2016 | Yasuda | H01L 29/0619 |
| 2018/0226495 A1 | 8/2018 | Kang | |
| 2018/0301537 A1 | 10/2018 | Weyers | |

FOREIGN PATENT DOCUMENTS

| | | |
|---|---|---|
| JP | 2003229572 A | 8/2003 |
| JP | 2007158134 A | 6/2007 |
| JP | 2013214608 A | 10/2013 |
| JP | 2014053554 A | 3/2014 |
| JP | 2015119521 A | 6/2015 |
| JP | 2016111289 A | 6/2016 |
| JP | 2017089614 A | 5/2017 |
| WO | 2017141560 A1 | 8/2017 |

OTHER PUBLICATIONS

Those references were submitted as IDS over the earlier U.S. Appl. No. 17/133,692, filed Dec. 24, 2020.

* cited by examiner

SEMICONDUCTOR DEVICE AND METHOD FOR FABRICATING SEMICONDUCTOR DEVICE

CROSS-REFERENCE TO RELATED APPLICATIONS

This application is a divisional of U.S. patent application Ser. No. 17/133,692 filed on Dec. 24, 2020, which claims priority to Japanese Patent Application No. 2020-028468 filed on Feb. 21, 2020, the entirety of the contents of which are hereby incorporated herein by reference.

BACKGROUND

1. Technical Field

The present invention relates to a semiconductor device and a fabricating method for the semiconductor device.

2. Related Art

Patent Document 1 discloses providing a Zener diode in a semiconductor device that includes a sense IGBT.
Patent Document 1: International Publication WO 2017/141560

DESCRIPTION OF EXEMPLARY EMBODIMENTS

Figure 1A:
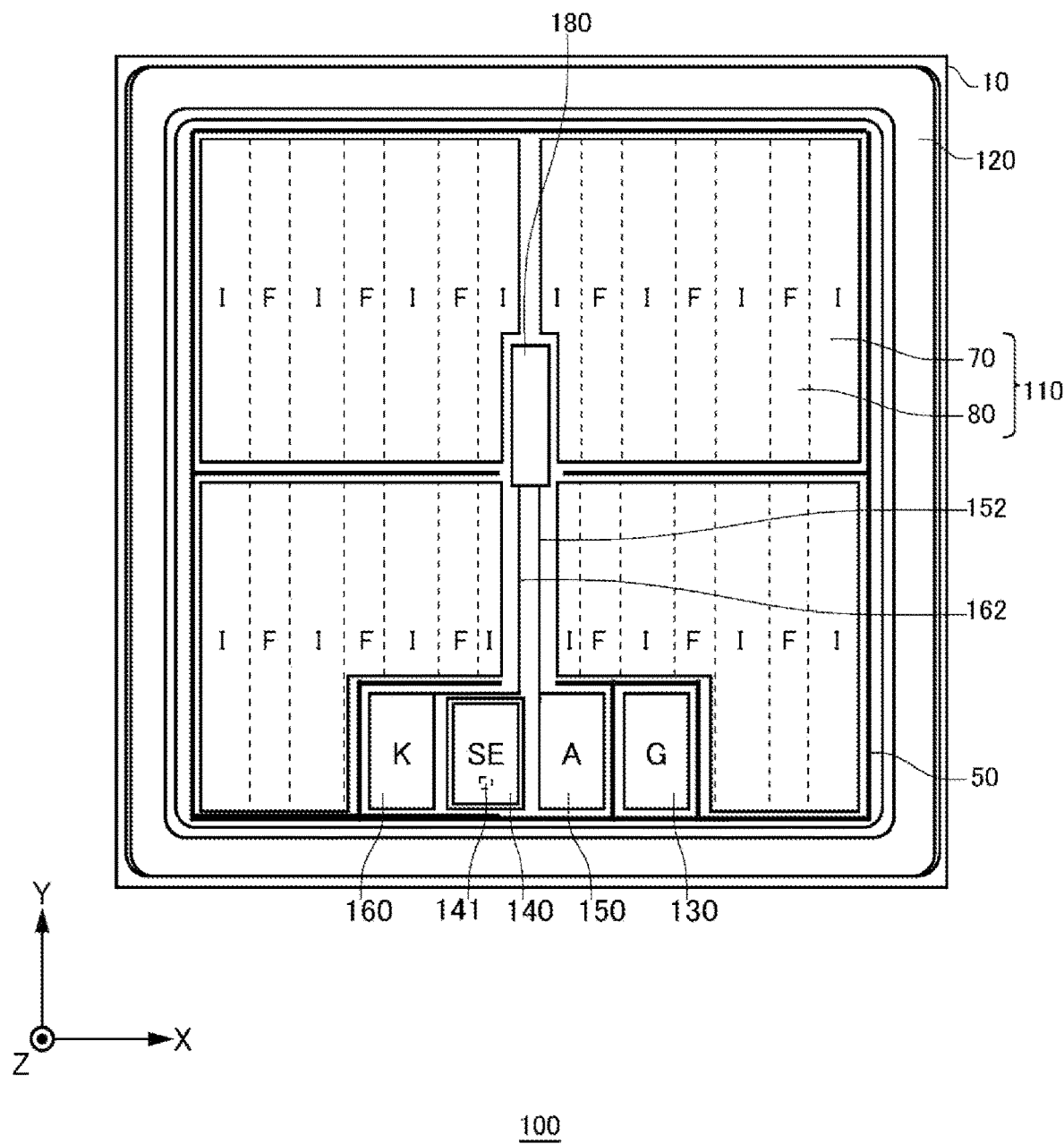
FIG. 1A shows an example of a top surface view of a semiconductor device 100 according to a first embodiment.

Hereinafter, some embodiments of the present invention will be described, but the following embodiments do not limit the invention according to the claims. Furthermore, all the combinations of the features described in the embodiments are not necessarily essential to means provided by aspects of the invention.

In this Specification, one side of the semiconductor substrate in a direction parallel to a depth direction is referred to as the "front" or "top" and the other side is referred to as the "back" or "bottom". Among the two main surfaces of each substrate, layer, and other components, one surface is referred to as the "top surface" and the other surface is referred to as the "bottom surface". The directions of the "front," "top," "back," and "bottom" are not limited to the direction of gravity or to the directions when the semiconductor device is implemented.

In this Specification, technical terms may be described using an orthogonal coordinate system of the X-axis, Y-axis, and Z-axis. The orthogonal coordinate system merely specifies relative positions of configurational elements, and does not limit specific directions. For example, the Z-axis is not limited to being a height direction relative to the ground. The +Z-axis direction and the −Z-axis direction are directions opposite each other. If the Z-axis direction is referred to without a positive or negative sign, this refers to a direction parallel to both the +Z-axis and the −Z-axis. Furthermore, there are cases where a view from the +Z-axis direction is referred to as a top surface view.

In this Specification, the terms "same" or "equal" may include cases where there is an error caused by manufacturing variations or the like. This error is 10% or less, for example.

In the description in this Specification, the conductivity types of the doping regions that have been doped with impurities are P type and N type. However, the conductivity type of each doping region may be the opposite polarity. Furthermore, when P+ type or N+ type is used in this Specification, this means that the doping concentration is higher than when P type or N type is used, and when P− type or N− type is used, this means that the doping concentration is lower than when P type or N type is used.

In this Specification, the doping concentration refers to the concentration of impurities that have been activated as donors or acceptors. In this Specification, the difference between the concentration of the donors and the concentration of the acceptors may refer to the concentration of whichever is higher among the donors and acceptors. This concentration difference can be measured using a capacitance-voltage measurement method (CV method). Furthermore, a carrier concentration measured using a spread resistance (SR) measurement method may be set as the concentration of the donors or acceptors. Furthermore, in the case where the concentration distribution of the donors or acceptors has a peak, the peak value may be the concentration of the donors or the acceptors in the region. In a case where the concentration of donors or acceptors in a region where donors or acceptors are present is approximately uniform, the average value of the donor concentration or the acceptor concentration in this region may be used as the donor concentration or acceptor concentration.

FIG. 1A shows an example of a top surface view of a semiconductor device 100 according to a first embodiment. The semiconductor device 100 is a semiconductor chip that includes a transistor portion 70 and a diode portion 80. The semiconductor device 100 includes a temperature sensing portion 180, and may be mounted in a module such as an IPM (Intelligent Power Module).

The transistor portion 70 includes a transistor such as an IGBT (Insulated Gate Bipolar Transistor). The diode portion 80 includes a diode such as an FWD (Free Wheel Diode). The semiconductor device 100 of the present example is an RC-IGBT (Reverse Conducting IGBT) that includes the transistor portion 70 and the diode portion 80 on the same chip.

A semiconductor substrate 10 may be a silicon substrate, a silicon carbide substrate, a nitride semiconductor substrate of gallium nitride or the like, or the like. The semiconductor substrate 10 of the present example is a silicon substrate. The semiconductor substrate 10 includes an active region 110 and a peripheral region 120.

The transistor portion 70 is a region where a collector region provided on a bottom surface side of the semiconductor substrate 10 is projected onto the top surface of the semiconductor substrate 10. The collector region has a second conductivity type. The collector region is P+ type, for example.

The diode portion 80 is a region where a cathode region provided on a bottom surface side of the semiconductor substrate 10 is projected onto the top surface of the semiconductor substrate 10. The cathode region has a first conductivity type. The cathode region of the present example is N+ type, for example.

The transistor portion 70 and the diode portion 80 are arranged periodically in an alternating manner in the XY-plane. The transistor portion 70 and the diode portion 80 of the present example include a plurality of transistor portions and diode portions. A gate metal layer 50 is provided above the semiconductor substrate 10 in the regions between the transistor portion 70 and the diode portion 80.

The transistor portion 70 and the diode portion 80 of the present example include trench portions extending in the Y-axis direction. However, the transistor portion 70 and the diode portion 80 may include trench portions extending in the X-axis direction.

The active region 110 includes the transistor portion 70 and the diode portion 80. The active region 110 is a region where a main current flows between the top surface and the bottom surface of the semiconductor substrate 10 when the semiconductor device 100 is controlled to be in the ON state. That is, the active region 110 is a region where current flows in a depth direction within the semiconductor substrate 10, from the top surface to the bottom surface or from the bottom surface to the top surface of the semiconductor substrate 10. In this Specification, the transistor portion 70 and the diode portion 80 each refer to an element portion or an element region.

In the top surface view, a region sandwiched between two element portions is also the active region 110. In the present example, the regions sandwiched between element portions and provided with the gate metal layer 50 are also included in the active region 110.

The gate metal layer 50 is formed of a material including metal. For example, the gate metal layer 50 is formed of aluminum, an aluminum-silicon alloy, or an aluminum-silicon-copper alloy. The gate metal layer 50 is electrically connected to a gate conducting portion of the transistor portion 70, and supplies a gate voltage to the transistor portion 70. The gate metal layer 50 is provided in a manner to surround an outer periphery of the active region 110, in the top surface view. The gate metal layer 50 is electrically connected to a gate pad 130 provided in the peripheral region 120. The gate metal layer 50 may be provided along the outer peripheral edge of the semiconductor substrate 10. Furthermore, the gate metal layer 50 may be provided around the temperature sensing portion 180 or between the transistor portion 70 and the diode portion 80, in the top surface view.

The peripheral region 120 is a region between the active region 110 and the peripheral edge of the semiconductor substrate 10, in the top surface view. The peripheral region 120 is provided surrounding the active region 110, in the top surface view. One or more metal pads for connecting the semiconductor device 100 and an external apparatus to each other with wires or the like may be arranged in the peripheral region 120. The peripheral region 120 may include an edge termination structure portion. The edge termination structure portion relaxes the electric field concentration on the top surface side of the semiconductor substrate 10. For example, the edge termination structure portion includes a guard ring, a field plate, a RESURF, and a structure that is a combination of these components.

Front surface electrodes are provided above the semiconductor substrate 10. The front surface electrodes include an emitter electrode 52, which is described further below. The front surface electrodes may include the gate pad 130, a sense electrode 140, an anode pad 150, and a cathode pad 160. The front surface electrodes may be connected to an external electrode of the semiconductor device 100 by wire bonding or the like. The number of front surface electrodes and the positions of the front surface electrodes are not limited to those of the present example.

The gate pad 130 is electrically connected to the gate conducting portion of the transistor portion 70, via the gate metal layer 50. The gate pad 130 is set to a gate potential. The gate pad 130 of the present example has a rectangular shape in the top surface view.

The sense electrode 140 is electrically connected to a current sensing portion 141. The sense electrode 140 detects the current flowing through the current sensing portion 141. The sense electrode 140 of the present example has a rectangular shape in the top surface view.

The current sensing portion 141 detects the current flowing through the transistor portion 70. The current sensing portion 141 is provided below the sense electrode 140. The current sensing portion 141 has a structure corresponding to the transistor portion 70 and simulates the operation of the transistor portion 70. A current that is proportional to the current flowing through the transistor portion 70 flows through the current sensing portion 141. Accordingly, it is possible to observe the current flowing through the transistor portion 70.

The anode pad 150 is electrically connected to an anode region of the temperature sensing portion 180. The anode pad 150 is connected to the anode region of the temperature sensing portion 180 by an anode wire 152. The anode pad 150 of the present embodiment has a rectangular shape in the top surface view.

The cathode pad 160 is electrically connected to a cathode region of the temperature sensing portion 180. The cathode pad 160 is connected to the cathode region of the temperature sensing portion 180 by a cathode wire 162. The cathode pad 160 of the present example has a rectangular shape in the top surface view.

The temperature sensing portion 180 is provided above the active region 110. The temperature sensing portion 180 senses the temperature of the active region 110. The temperature sensing portion 180 may include a diode formed of monocrystalline or polycrystalline silicon. The temperature sensing portion 180 is used to detect the temperature of the semiconductor device 100 and protect the semiconductor chip from overheating. The temperature sensing portion 180 is connected to a constant current source. When the temperature of the semiconductor device 100 changes, the forward voltage of the current flowing through the temperature sensing portion 180 changes. The semiconductor device 100 can detect the temperature based on the change of the forward voltage. The temperature sensing portion 180 has a longitudinal direction in the Y-axis direction and a transverse direction in the X-axis direction, but is not limited to this.

The temperature sensing portion 180 of the present example is provided near the center of the active region 110, in the top surface view. The temperature sensing portion 180 may be provided in any region of the transistor portion 70 and the diode portion 80. That is, the collector region of the second conductivity type or the cathode region of the first conductivity type may be provided on a bottom surface side of the semiconductor substrate 10 provided with the temperature sensing portion 180. The temperature sensing portion 180 is provided adjacent to the transistor portion 70 and the diode portion 80.

The anode wire 152 and the cathode wire 162 are provided above the active region 110, in the top surface view. Furthermore, the anode wire 152 and the cathode wire 162 are provided extending from the temperature sensing portion 180 to the peripheral region 120. The anode wire 152 and the cathode wire 162 of the present example are provided extending in the Y-axis direction from the temperature sensing portion 180. The anode wire 152 and the cathode wire 162 may be formed of the same material as the front surface electrodes.

Figure 1B:
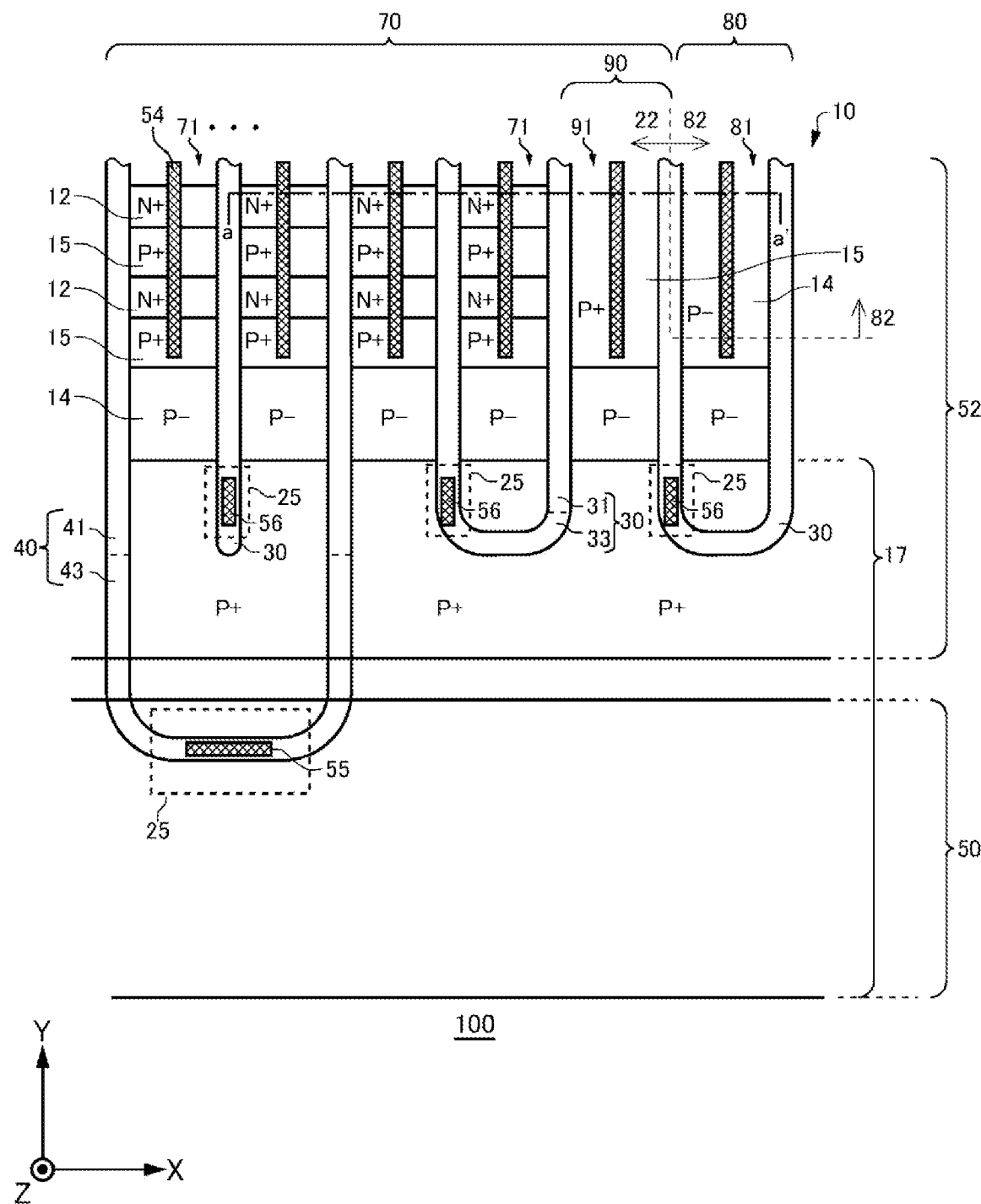
FIG. 1B shows an example of a top surface view of a semiconductor device 100 according to a first embodiment.

FIG. 1B shows an example of a top surface view of the semiconductor device 100 according to a first embodiment example. In the present example, an enlarged view of an end portion of the active region 110 is shown.

The transistor portion 70 is a region where a collector region 22 provided on a back surface side of the semiconductor substrate 10 is projected onto the top surface of the semiconductor substrate 10. The collector region 22 has the second conductivity type. The collector region 22 of the present example is P+ type, for example. The transistor portion 70 includes a boundary portion 90 located at a boundary between the transistor portion 70 and the diode portion 80.

The diode portion 80 is a region where a cathode region 82 provided on a back surface side of the semiconductor substrate 10 is projected onto the top surface of the semiconductor substrate 10. The cathode region 82 has the first conductivity type. The cathode region 82 of the present example is N+ type, for example.

The semiconductor device 100 of the present example includes a gate trench portion 40, a dummy trench portion 30, an emitter region 12, a base region 14, a contact region 15, and a well region 17 on the front surface of the semiconductor substrate 10. Furthermore, the semiconductor device 100 of the present example includes the emitter electrode 52 and the gate metal layer 50 provided above the front surface of the semiconductor substrate 10.

The emitter electrode 52 is provided above the gate trench portion 40, the dummy trench portion 30, the emitter region 12, the base region 14, the contact region 15, and the well region 17. The gate metal layer 50 is provided above the gate trench portion 40 and the well region 17. The emitter electrode 52 of the present example is set to the emitter potential of the transistor portion 70.

The emitter electrode 52 and the gate metal layer 50 are formed of a material including metal. For example, at least a partial region of the emitter electrode 52 may be formed of aluminum, an aluminum-silicon alloy, or an aluminum-silicon-copper alloy. The emitter electrode 52 may include barrier metal formed of titanium, a titanium compound, or the like in an underlayer of a region formed of aluminum or the like. The emitter electrode 52 and the gate metal layer 50 are provided separated from each other. The emitter electrode 52 and the gate metal layer 50 are provided above the semiconductor substrate 10, sandwiching an interlayer dielectric film 38. The interlayer dielectric film 38 is omitted from FIG. 1A. A contact hole 54, a contact hole 55, and a contact hole 56 are provided penetrating through the interlayer dielectric film 38.

The contact hole 55 connects the gate metal layer 50 and the gate conducting portion inside the transistor portion 70. A plug made of tungsten or the like may be formed inside the contact hole 55.

The contact hole 56 connects the emitter electrode 52 and a dummy conducting portion inside the dummy trench portion 30. A plug made of tungsten or the like may be formed inside the contact hole 56.

A connecting portion 25 electrically connects the front surface electrodes of the emitter electrode 52 or the gate metal layer 50 or the like to the semiconductor substrate 10. As an example, the connecting portion 25 is provided between the gate metal layer 50 and the gate conducting portion. The connecting portion 25 is also provided between the emitter electrode 52 and the dummy conducting portion. The connecting portion 25 is a conductive material, such as polysilicon doped with impurities. Here, the connecting portion 25 is polysilicon (N+) doped with N type impurities. The connecting portion 25 is provided above the front surface of the semiconductor substrate 10, with an insulating film or the like such as an oxide film interposed therebetween.

Gate trench portions 40 are arranged at prescribed intervals along a prescribed arrangement direction (X-axis direction in the present example). Each gate trench portion 40 of the present example may include two extending portions 41 that are parallel to the front surface of the semiconductor substrate 10 and extend along an extension direction (Y-axis direction in the present example) perpendicular to the arrangement direction, and a connecting portion 43 that connects the two extending portions 41.

At least part of the connecting portion 43 is preferably formed with a curved shape. By connecting the end portions of the two extending portions 41 of the gate trench portion 40, it is possible to relax the electric field concentration at the end portions of the extending portions 41. The gate metal layer 50 may be connected to the gate conducting portion at the connecting portion 43 of the gate trench portion 40.

The dummy trench portion 30 is a trench portion that is electrically connected to the emitter electrode 52. Dummy trench portions 30 are arranged at prescribed intervals along the prescribed arrangement direction (X-axis direction in the present example), in the same manner as the gate trench portions 40. The dummy trench portions 30 of the present example may be U-shaped in the front surface of the semiconductor substrate 10, in the same manner as the gate trench portions 40. In other words, each dummy trench portion 30 may include two extending portions 31 that extend along the extension direction and a connecting portion 33 that connects the two extending portions 31.

The transistor portion 70 of the present example has a structure in which two gate trench portions 40 and three dummy trench portions 30 are arranged in a repeating manner. That is, the transistor portion 70 of the present example includes the gate trench portions 40 and the dummy trench portions 30 with a 2:3 ratio. For example, the transistor portion 70 includes one extending portion 31 between two extending portions 41. Furthermore, the transistor portion 70 includes two extending portions 31 adjacent to a gate trench portion 40.

It should be noted that the ratio of gate trench portions 40 to dummy trench portions 30 is not limited to that of the present example. The ratio of gate trench portions 40 to dummy trench portions 30 may be 1:1 or 2:4. Furthermore, the transistor portion 70 may have a so-called full gate structure, in which all of the trench portions are gate trench portions 40, and dummy trench portions 30 are not provided.

The well region 17 is a region of the second conductivity type provided closer to the front surface side of the semiconductor substrate 10 than a drift region 18, which is described further below. The well region 17 is an example of a well region provided on an edge side of the semiconductor device 100. The well region 17 is P+ type, for example. The well region 17 is formed in a predetermined range from an end portion of the side of active region where the gate metal layer 50 is provided. The diffusion depth of the well region 17 may be greater than the depths of the gate trench portions 40 and the dummy trench portions 30. Partial regions of the gate trench portions 40 and the dummy trench portions 30 on the gate metal layer 50 side are formed in the well region 17. The floors at the ends of the gate trench portions 40 and the dummy trench portions 30 in the extension direction may be covered by the well region 17.

A contact hole 54 is formed above each of the emitter region 12 and the contact region 15 in the transistor portion 70. Furthermore, a contact hole 54 is provided above the base region 14 in the transistor portion 70. A contact hole 54 is provided above the contact region 15 in the boundary portion 90. A contact hole 54 is provided above the base region 14 in the diode portion 80. No contact holes 54 are provided above the well regions 17 provided at both ends in the Y-axis direction. In this way, one or more contact holes 54 are formed in the interlayer dielectric film. The one or more contact holes 54 may be provided extending in the extension direction.

The boundary portion 90 is a region provided in the transistor portion 70 and adjacent to the diode portion 80. The boundary portion 90 includes the contact region 15. The boundary portion 90 of the present example does not include the emitter region 12. As an example, the trench portions of the boundary portion 90 are dummy trench portions 30. The boundary portion 90 of the present example is arranged such that both ends thereof in the X-axis direction are dummy trench portions 30.

A mesa portion 71, a mesa portion 91, and a mesa portion 81 are mesa portions provided adjacent to trench portions within a plane parallel to the front surface of the semiconductor substrate 10. A mesa portion may be a portion of the semiconductor substrate 10 sandwiched by two trench portions that are adjacent to each other, and may be a portion thereof from the front surface of the semiconductor substrate 10 to the depth of the deepest floor portion of each trench portion. The extending portions of each trench portion may be treated as one trench portion. That is, a region sandwiched between two extending portions may be treated as a mesa portion.

The mesa portion 71 is provided adjacent to at least one of dummy trench portion 30 or gate trench portion 40 in the transistor portion 70. The mesa portion 71 includes the well region 17, the emitter region 12, the base region 14, and the contact region 15, in the front surface of the semiconductor substrate 10. In the mesa portion 71, the emitter region 12 and the contact region 15 are provided in an alternating manner in the extension direction.

The mesa portion 91 is provided in the boundary portion 90. The mesa portion 91 includes the contact region 15 and the well region 17, in the front surface of the semiconductor substrate 10.

The mesa portion 81 is provided in a region sandwiched by dummy trench portions 30 that are adjacent to each other, in the diode portion 80. The mesa portion 81 includes the base region 14, the contact region 15, and the well region 17, in the front surface of the semiconductor substrate 10.

The base region 14 is a region of the second conductivity type provided on the front surface side of the semiconductor substrate 10 in the transistor portion 70 and the diode portion 80. The base region 14 is P− type, for example. The base region 14 may be provided at both end portions in the Y-axis direction of the mesa portion 71 and the mesa portion 91, in the front surface of the semiconductor substrate 10. Note that FIG. 1A shows only one Y-axis-direction end portion of this base region 14.

The emitter region 12 is a region of the first conductivity type that has a higher doping concentration than the drift region 18. The emitter region 12 of the present example is N+ type, for example. One example of the dopant of the emitter region 12 is arsenic (As). The emitter region 12 is provided in contact with the gate trench portion 40, in the front surface of the mesa portion 71. The emitter region 12 may be provided extending in the X-axis direction from one of two trench portions sandwiching the mesa portion 71 to the other. The emitter region 12 is also provided below the contact hole 54.

Furthermore, the emitter region 12 may or may not be in contact with the dummy trench portions 30. The emitter region 12 of the present example is in contact with the dummy trench portions 30. The emitter region 12 does not need to be provided in the mesa portion 91 of the boundary portion 90.

The contact region 15 is a region of the second conductivity type that has a higher doping concentration than the base region 14. The contact region 15 of the present example is P+ type, for example. The contact region 15 of the present example is provided in the front surfaces of the mesa portion 71 and the mesa portion 91. The contact region 15 may be provided extending in the X-axis direction from one of two trench portions sandwiching the mesa portion 71 or the mesa portion 91 to the other. The contact region 15 may or may not be in contact with the gate trench portions 40. Furthermore, the contact region 15 may or may not be in contact with the dummy trench portions 30. In the present example, the contact region 15 contacts the dummy trench portions 30 and the gate trench portions 40. The contact region 15 is provided below the contact hole 54. The contact region 15 may also be provided in the mesa portion 81.

Figure 1C:
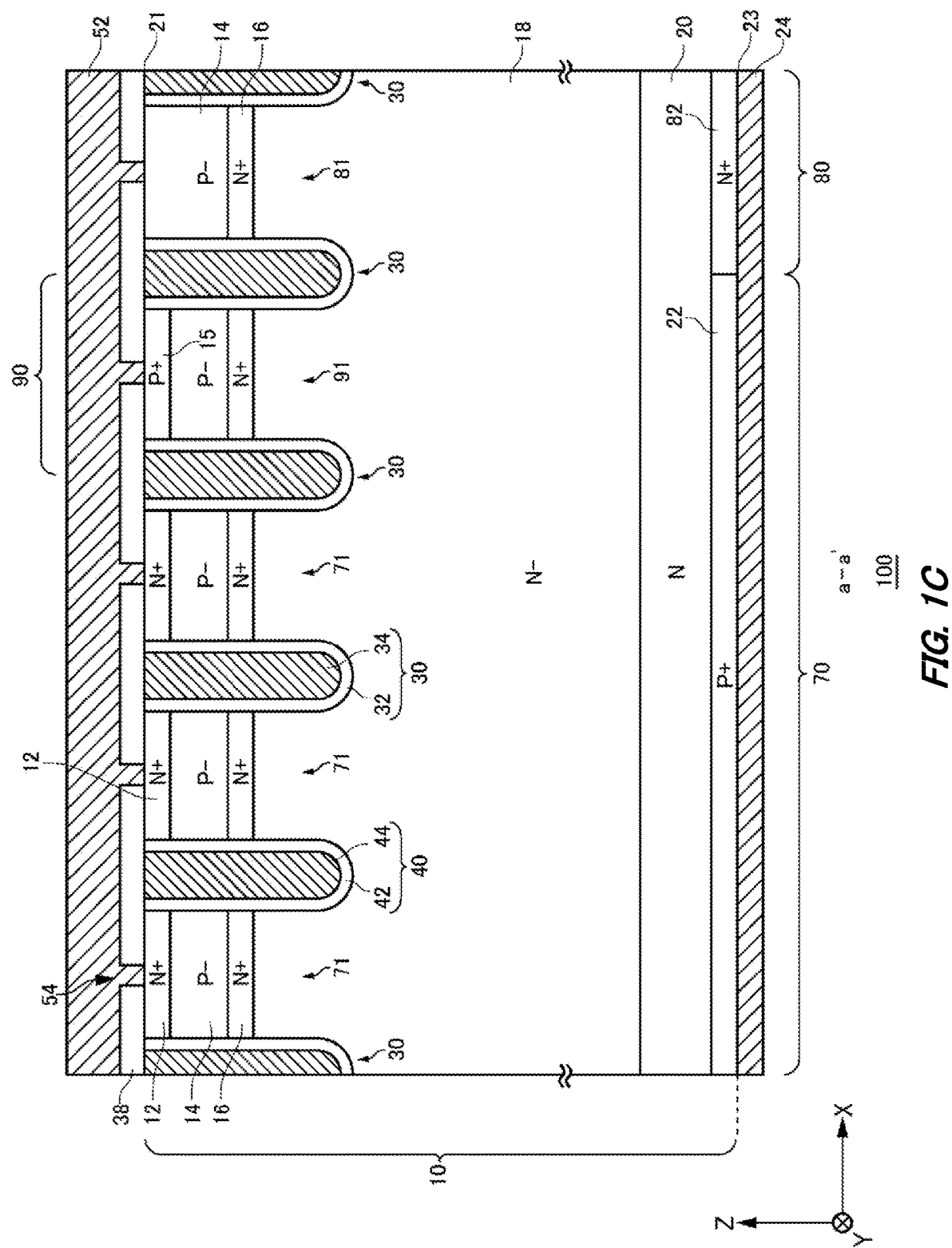
FIG. 1C shows an example of the a-a' cross section in FIG. 1B.

FIG. 1C shows an example of the a-a' cross section in FIG. 1B. The a-a' cross section is an XZ-plane passing through the emitter region 12 in the transistor portion 70. The semiconductor device 100 of the present example includes the semiconductor substrate 10, the interlayer dielectric film 38, the emitter electrode 52, and the collector electrode 24, in the a-a' cross section. The emitter electrode 52 is formed above the semiconductor substrate 10 and the interlayer dielectric film 38.

The drift region 18 is a region of the first conductivity type provided in the semiconductor substrate 10. The drift region 18 of the present example is N− type, for example. The drift region 18 may be a region of the semiconductor substrate 10 remaining without having another doping region formed therein. That is, the doping concentration of the drift region 18 may be the doping concentration of the semiconductor substrate 10.

A buffer region 20 is a region of the first conductivity type provided below the drift region 18. The buffer region 20 of the present example is N type, for example. The doping concentration of the buffer region 20 is higher than the doping concentration of the drift region 18. The buffer region 20 may function as a field stop layer that prevents the depletion layer expanding from the bottom surface side of the base region 14 from reaching the collector region 22 of the second conductivity type and the cathode region 82 of the first conductivity type.

The collector region 22 is provided below the buffer region 20 in the transistor portion 70. The cathode region 82 is provided below the buffer region 20 in the diode portion 80. The boundary between the collector region 22 and the cathode region 82 is the boundary between the transistor portion 70 and the diode portion 80.

The collector electrode 24 is formed on a back surface 23 of the semiconductor substrate 10. The collector electrode 24 is formed of a conductive material such as metal.

The base region 14 is a region of the second conductivity type provided above the base region 14, in the mesa portion 71, the mesa portion 91, and the mesa portion 81. The base region 14 is provided in contact with the gate trench portions 40. The base region 14 may be provided in contact with the dummy trench portions 30.

The emitter region 12 is provided between the base region 14 and a front surface 21 in the mesa portion 71. The emitter region 12 is provided in contact with the gate trench portions 40. The emitter region 12 may or may not be in contact with the dummy trench portions 30. The emitter region 12 may not be provided in the mesa portion 91.

The contact region 15 is provided above the base region 14, in the mesa portion 91. The contact region 15 is provided in contact with the gate trench portions 40, in the mesa portion 91. In another cross section, the contact region 15 is provided in the front surface 21 of the mesa portion 71.

An accumulation region 16 is a region of the first conductivity type provided closer to the front surface 21 side of the semiconductor substrate 10 than the drift region 18. The accumulation region 16 of the present example is N+ type, for example. The accumulation region 16 is provided in the transistor portion 70 and the diode portion 80. The accumulation region 16 of the present example is provided in the boundary portion 90 as well. In this way, the semiconductor device 100 can avoid mask deviation of the accumulation region 16.

Furthermore, the accumulation region 16 is provided in contact with the gate trench portions 40. The accumulation region 16 may or may not be in contact with the dummy trench portions 30. The doping concentration of the accumulation region 16 is higher than the doping concentration of the drift region 18. By providing the accumulation region 16, it is possible to increase the carrier injection enhancement effect (IE effect) and decrease the ON voltage of the transistor portion 70.

One or more gate trench portions 40 and one or more dummy trench portions 30 are provided in the front surface 21. Each trench portion is provided from the front surface 21 to the drift region 18. In a region where at least any one of the emitter region 12, the base region 14, the contact region 15, and the accumulation region 16 is provided, each trench portion penetrates through these regions to reach the drift region 18. Having a trench portion penetrate through the doping region is not limited to a structure in which the doping region is formed and then the trench portion is formed, in this order. A structure in which the doping region is formed between trench portions after the trench portions have been formed is also included in the concept of the trench portions penetrating through the doping region.

The gate trench portion 40 includes a gate trench, a gate insulating film 42, and a gate conducting portion 44 formed in the front surface 21. The gate insulating film 42 is formed covering the inner wall of the gate trench. The gate insulating film 42 may be formed by oxidizing or nitriding the semiconductor of the inner wall of the gate trench. The gate conducting portion 44 is formed farther inward than the gate insulating film 42, within the gate trench. The gate insulating film 42 insulates the gate conducting portion 44 and the semiconductor substrate 10 from each other. The gate conducting portion 44 is formed of a conductive material such as polysilicon. The gate trench portion 40 is covered by the interlayer dielectric film 38 on the front surface 21.

The gate conducting portion 44 includes a region sandwiching the gate insulating film 42 and facing the base region 14 that is adjacent on the mesa portion 71 side, in the depth direction of the semiconductor substrate 10. When a prescribed voltage is applied to the gate conducting portion 44, a channel is formed by an electron inversion layer in the front surface of the interface contacting the gate trench portion of the base region 14.

The dummy trench portion 30 may have the same structure as the gate trench portion 40. The dummy trench portion 30 includes a dummy trench, a dummy insulating film 32, and a dummy conducting portion 34 formed on the front surface 21 side. The dummy insulating film 32 is formed covering the inner wall of the dummy trench. The dummy conducting portion 34 is formed inside the dummy trench, and is formed farther inward than the dummy insulating film 32. The dummy insulating film 32 insulates the dummy conducting portion 34 and the semiconductor substrate 10 from each other. The dummy trench portion 30 is covered by the interlayer dielectric film 38 on the front surface 21.

The interlayer dielectric film 38 is provided on the front surface 21. The emitter electrode 52 is provided above the interlayer dielectric film 38. One or more contact holes 54 for electrically connecting the emitter electrode 52 and the semiconductor substrate 10 are provided in the interlayer dielectric film 38. In the same manner, a contact hole 55 and a contact hole 56 may be provided penetrating through the interlayer dielectric film 38.

Figure 2A:
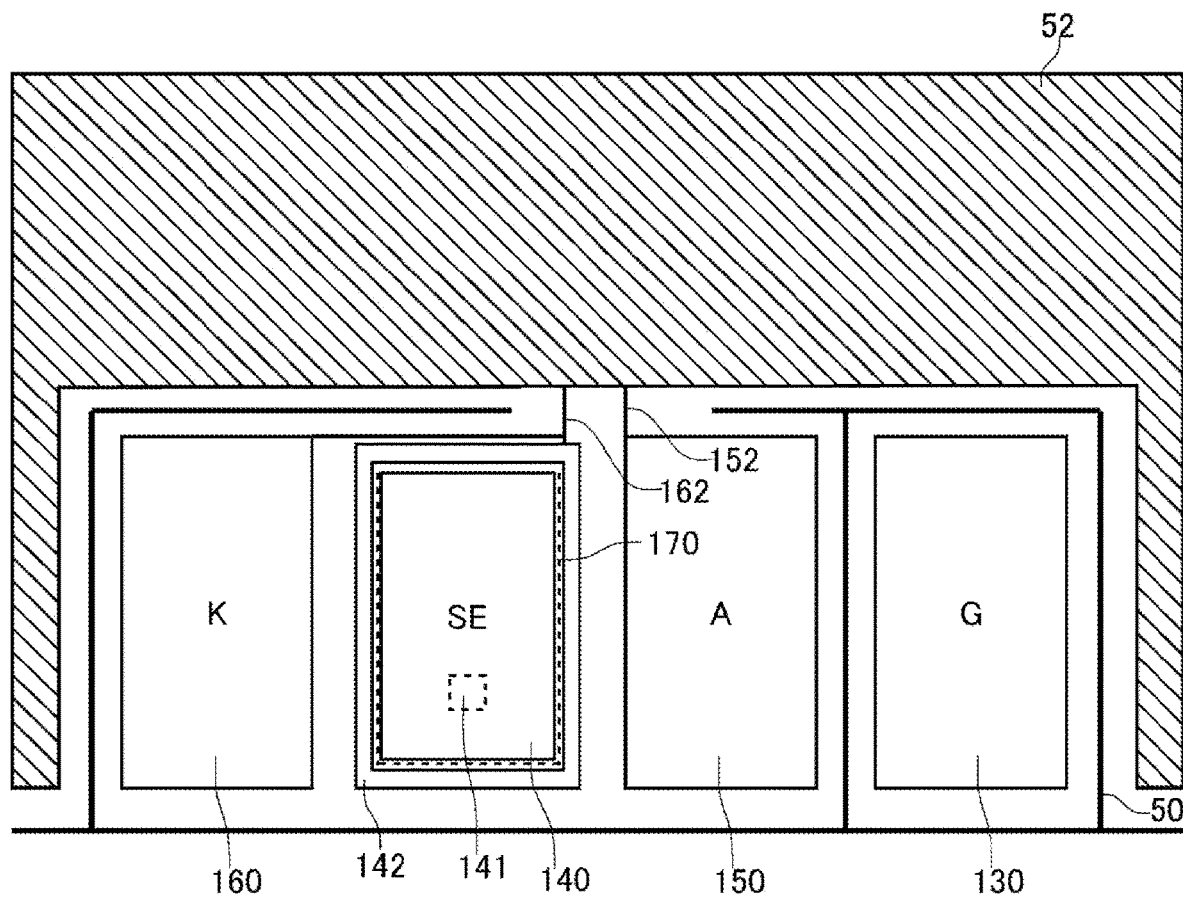
FIG. 2A shows an example of an enlarged view of the top surface in the vicinity of the sense electrode 140.

FIG. 2A shows an example of an enlarged view of the top surface in the vicinity of the sense electrode 140. The semiconductor device 100 includes a Zener diode 170. The Zener diode 170 is a diode for overvoltage protection. By providing the Zener diode 170, the semiconductor device 100 can prevent breakdown of the current sensing portion 141 due to overvoltage. The Zener diode 170 of the present example is electrically connected between the emitter electrode 52 and the sense electrode 140. The Zener diode 170 is provided on the semiconductor substrate 10. It should be noted that, since the Zener diode 170 of the present example is provided in the peripheral region 120, there is no need to reduce the surface area of the active region 110.

In one example, the Zener diode 170 is provided along the outer periphery of the sense electrode 140, in the top surface view. The Zener diode 170 may be provided along two sides of the sense electrode 140. The Zener diode 170 of the present example is provided along at least three sides of the sense electrode 140.

As an example, the bonding length of the Zener diode 170 is greater than or equal to 20% and less than or equal to 100% of the outer periphery of the sense electrode 140. The bonding length of the Zener diode 170 refers to the length that the Zener diode 170 extends in the top surface view. In one example, the bonding length of the Zener diode 170 is greater than or equal to 0.6 mm and less than or equal to 3.0 mm. By increasing the bonding length of the Zener diode 170, the current flowing through the Zener diode 170 is increased.

An emitter potential electrode 142 is set to the emitter potential of the transistor portion 70. The emitter potential electrode 142 is electrically connected to the Zener diode 170. The emitter potential electrode 142 is provided along the outer periphery of the sense electrode 140, in the top surface view. The emitter potential electrode 142 of the present example is provided covering the entire perimeter of the sense electrode 140, but is not limited to this. The emitter potential electrode 142 may be formed of the same material as a front surface electrode such as the sense electrode 140.

Figure 2B:
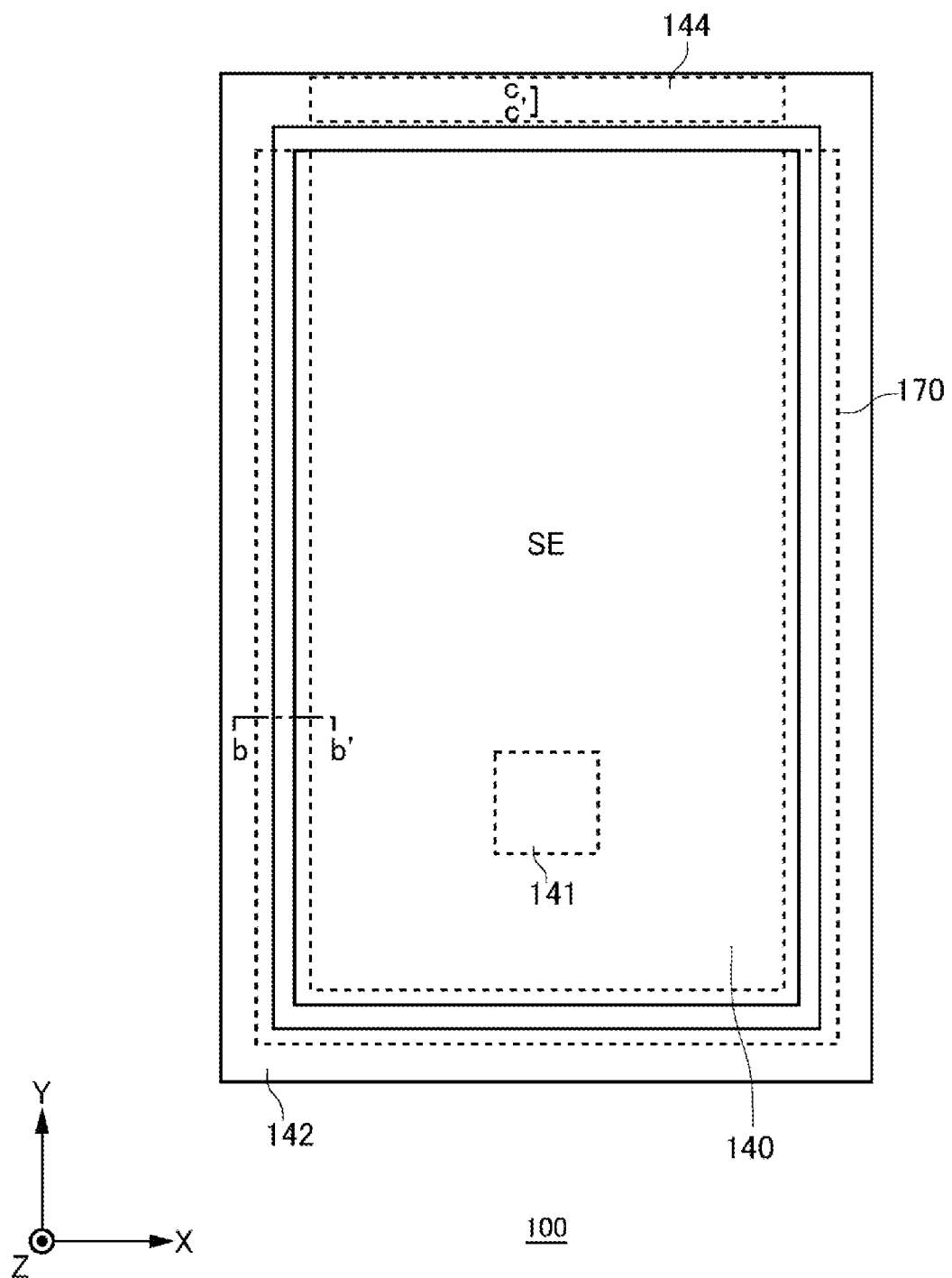
FIG. 2B is an example of an enlarged view of the sense electrode 140 and the emitter potential electrode 142.

FIG. 2B is an example of an enlarged view of the sense electrode 140 and the emitter potential electrode 142. The Zener diode 170 is provided below the sense electrode 140 and the emitter potential electrode 142. The Zener diode 170 is provided along the outer periphery of the sense electrode 140 and the inner periphery of the emitter potential electrode 142.

A contact portion 144 sets the emitter potential electrode 142 to the emitter potential. The contact portion 144 electrically connects the emitter potential electrode 142 and the well region 17 that is set to the emitter potential. The contact portion 144 is provided in a region where the Zener diode 170 is not provided. The contact portion 144 is described further below. In the present example, the contact portion 144 is provided along one side of the sense electrode 140, and the Zener diode 170 is provided along the other three sides of the sense electrode 140. The contact portion 144 may be provided along two or more sides of the sense electrode 140.

Figure 2C:
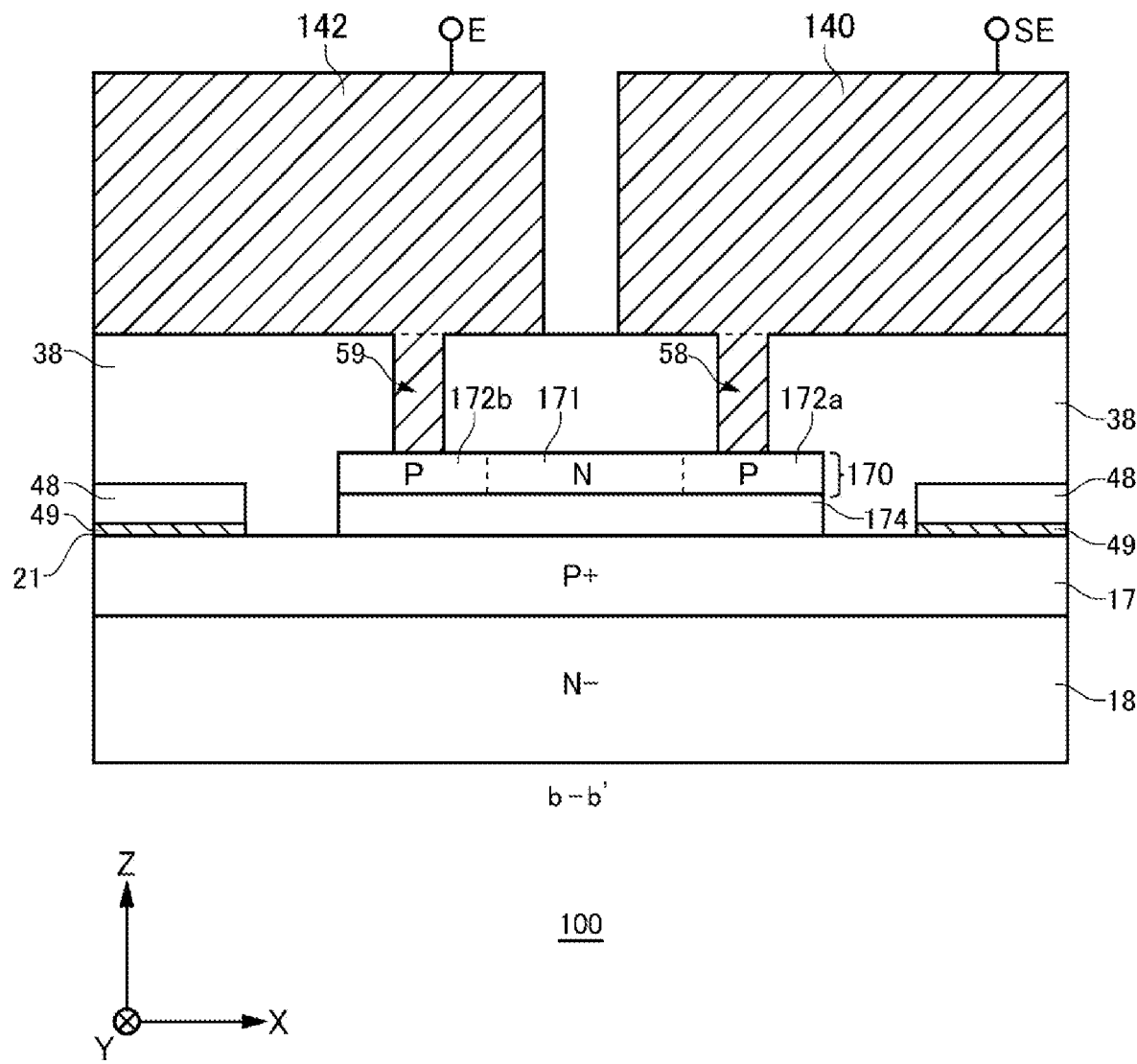
FIG. 2C shows an example of the b-b' cross section of FIG. 2B.

FIG. 2C shows an example of the b-b' cross section of FIG. 2B. The b-b' cross section is an XZ-plane passing through the Zener diode 170.

The Zener diode 170 includes a first-conductivity-type region 171 and a second-conductivity-type region 172. The second-conductivity-type region 172 includes a second-conductivity-type region 172a and a second-conductivity-type region 172b. The first-conductivity-type region 171 and the second-conductivity-type region 172 are arranged side by side in the top surface view. In the present example, the first-conductivity-type region 171 is provided between the second-conductivity-type region 172a and the second-conductivity-type region 172b.

The first-conductivity-type region 171 is a region of the first conductivity type that has a higher doping concentration than the drift region 18. The first-conductivity-type region 171 is provided between the second-conductivity-type region 172a and the second-conductivity-type region 172b. For example, the first-conductivity-type region 171 is formed using ion injection of arsenic. The first-conductivity-type region 171 may be formed using a process common to the other regions of the first conductivity type. Common processes refers to processes being performed at the same time and under the same conditions.

The second-conductivity-type region 172 is a region of the second conductivity type that has a higher doping concentration than the base region 14. The second-conductivity-type region 172a is electrically connected to the sense electrode 140, via the contact hole 58. The second-conductivity-type region 172b is electrically connected to the emitter potential electrode 142, via the contact hole 59. For example, the second-conductivity-type region 172 is formed using ion injection of boron. The second-conductivity-type region 172 may be formed by a process common to the other regions of the second conductivity type.

In one example, the Zener diode 170 is formed by injecting ions into a semiconductor layer of polysilicon or the like. The first-conductivity-type region 171 and the second-conductivity-type region 172 have the same film thickness. The film thicknesses of the first-conductivity-type region 171 and the second-conductivity-type region 172 may each be greater than or equal to 0.3 µm and less than or equal to 1 µm. For example, the film thicknesses of the first-conductivity-type region 171 and the second-conductivity-type region 172 are 0.5 µm. By suitably setting the film thickness of the Zener diode 170, it is possible to form a region of any conductivity type in the entire surface of the Zener diode 170 and subsequently invert a portion thereof to be a region of another conductivity type.

The interlayer dielectric film 38 is provided between the emitter potential electrode 142 and the well region 17. For example, the interlayer dielectric film 38 has a film thickness greater than or equal to 0.8 µm and less than or equal to 1.2 µm. A gate runner 48 that is set to the gate potential is provided below the interlayer dielectric film 38.

An interlayer dielectric film 174 is provided below the Zener diode 170. The interlayer dielectric film 174 is provided between the Zener diode 170 and the well region 17. As an example, the film thickness of the interlayer dielectric film 174 is less than or equal to 0.2 µm. The interlayer dielectric film 174 may be an HTO (High Temperature Oxide) film.

The gate runner 48 is a wire that is provided on the front surface 21 of the semiconductor substrate 10 and set to the gate potential. As an example, the gate runner 48 is formed by covering a conductive material such as polysilicon or metal to which impurities have been added with an insulating film such as polyimide. The film thickness of the gate runner 48 may be the same as or greater than the film thickness of the semiconductor layer of the Zener diode 170. In one example, the film thickness of the gate runner 48 is 0.8 µm.

A gate oxide film 49 is provided between the front surface 21 of the semiconductor substrate 10 and the gate runner 48. By providing the gate oxide film 49, it is possible to prevent a short from occurring between the front surface 21 and the gate runner 48. The film thickness of the gate oxide film 49 is preferably greater than or equal to 0.08 µm and less than or equal to 0.12 µm, and is more preferably 0.1 µm. The gate oxide film 49 may be formed using a process common to the dummy insulating film 32 and the gate insulating film 42.

Figure 2D:
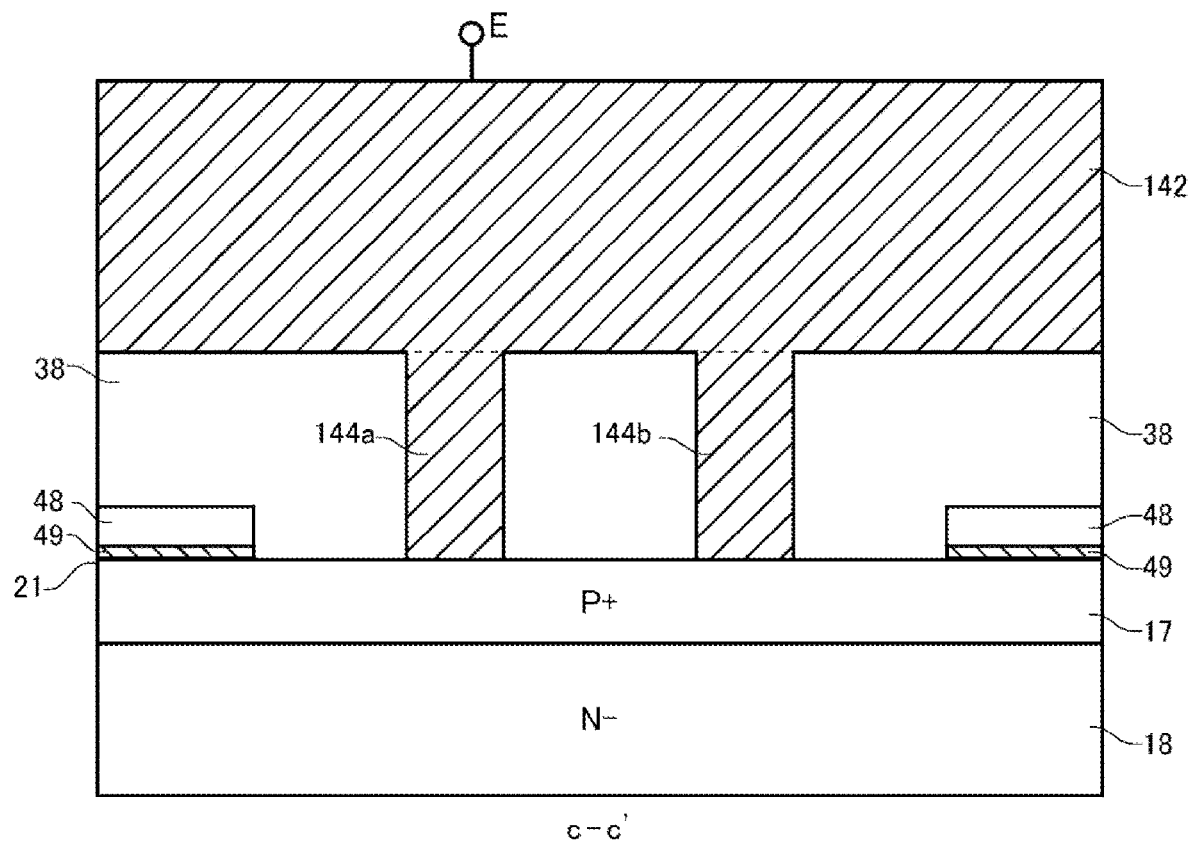
FIG. 2D shows an example of the c-c' cross section of FIG. 2B.

FIG. 2D shows an example of the c-c' cross section of FIG. 2B. The c-c' cross section is a YZ-plane passing through the contact portion 144.

The contact portion 144 is provided in contact holes of the interlayer dielectric film 38, and electrically connects the emitter potential electrode 142 and the well region 17. The contact portion 144 of the present example includes a contact portion 144a and a contact portion 144b, which are formed in different contact holes. The contact portion 144 may be provided extending in the X-axis direction. However, the shape of the contact portion 144 is not limited to this.

The well region 17 of the present example is set to the emitter potential. Accordingly, the emitter potential electrode 142 connected to the well region 17 by the contact portion 144 is set to the emitter potential.

Figure 3A:
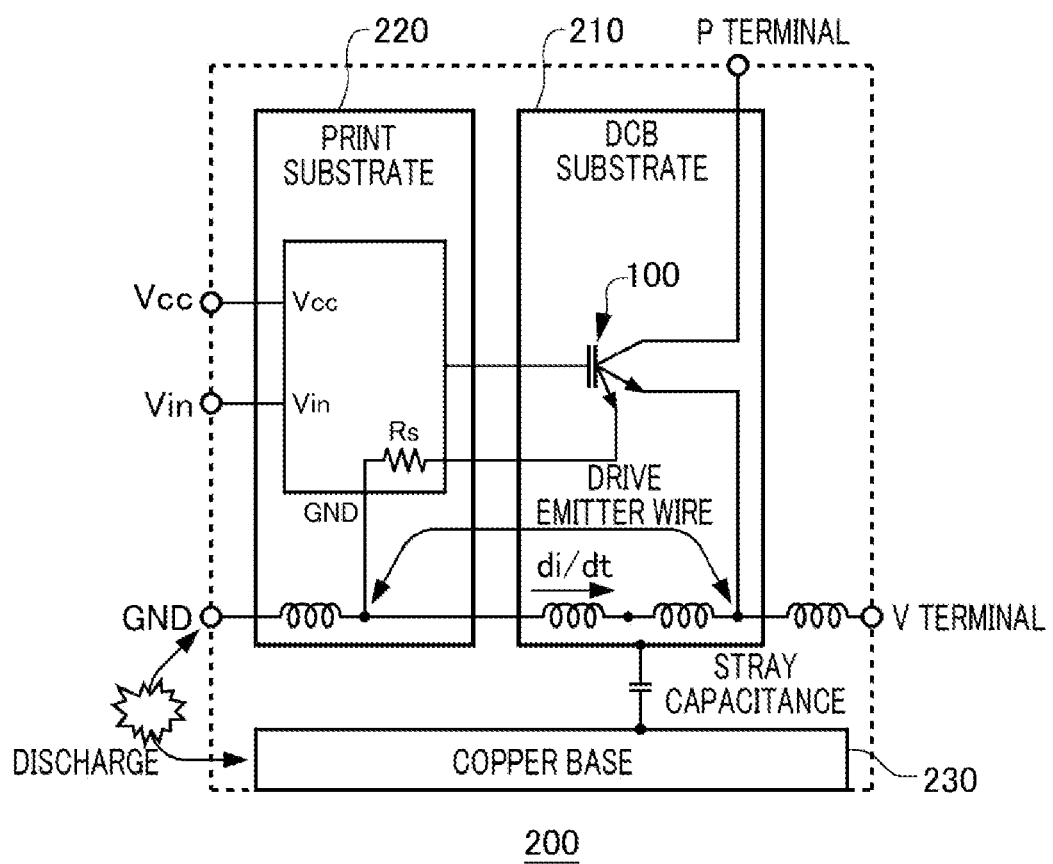
FIG. 3A shows an outline of a configuration of a semiconductor module 200 that includes the semiconductor device 100.

FIG. 3A shows an outline of a configuration of a semiconductor module 200 that includes the semiconductor device 100. The semiconductor module 200 includes a DCB substrate 210, a print substrate 220, and a copper base 230.

The DCB substrate 210 includes the semiconductor device 100 provided with the Zener diode 170. That is, the Zener diode 170 is provided on the DCB substrate 210 side. The print substrate 220 has a sense resistance Rs. The DCB substrate 210 is provided on the copper base 230 used for heat dissipation. There is a stray capacitance between the DCB substrate 210 and the copper base 230.

Here, there are cases where a noise current runs through the drive-emitter wire due to unexpected external discharge or the like, generating a di/dt electromotive force. There is a is a failure mode in which a sense IGBT of the current sensing portion 141 that has a small capacitance component breaks down due to the di/dt electromotive force. By providing the Zener diode 170, the semiconductor device 100 of the present example can prevent the failure of the sense IGBT. Furthermore, in the semiconductor device 100 of the present example, the Zener diode 170 is provided on the semiconductor substrate 10, and therefore it is possible to restrict the breakdown of the sense IGBT without adding an external protection circuit.

Figure 3B:
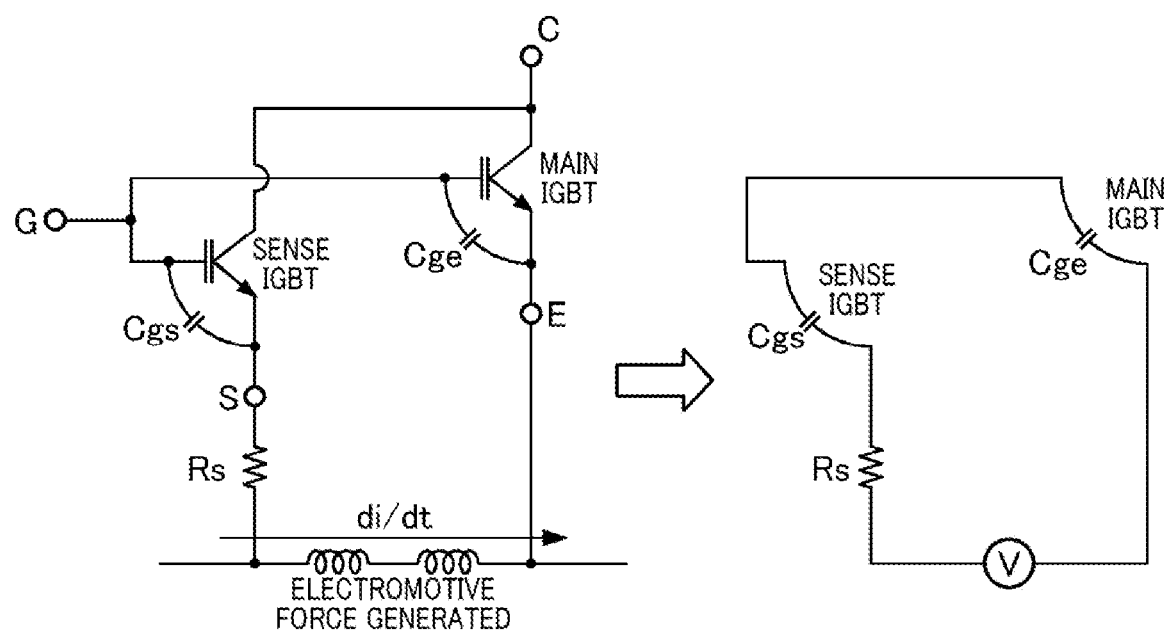
FIG. 3B shows an example of a circuit configuration of a semiconductor device according to a comparative example.

FIG. 3B shows an example of a circuit configuration of a semiconductor device according to a comparative example. Since the semiconductor device of the present example does not include the Zener diode 170, there are cases where the sense IGBT fails due to the G-S junction withstand voltage when the di/dt electromotive force occurs.

The main IGBT includes a collector electrode and a gate electrode that are common to the sense IGBT. The surface area of the active region of the sense IGBT is less than the surface area of the active region of the main IGBT. For example, the surface area of the active region of the sense IGBT is 1/1000 or less of the surface area of the active region of the main IGBT.

As an example, when the di/dt electromotive force occurs, overvoltage occurs at the G-E junction of the main IGBT and the G-S junction of the sense IGBT. Then, the G-S junction distributes the voltage according to the capacitance ratio between the gate capacitance Cge of the main IGBT and the gate capacitance Cgs of the sense IGBT. Here, when overvoltage exceeding the G-S junction withstand voltage of the sense IGBT occurs, there are cases where the sense IGBT fails.

Figure 3C:
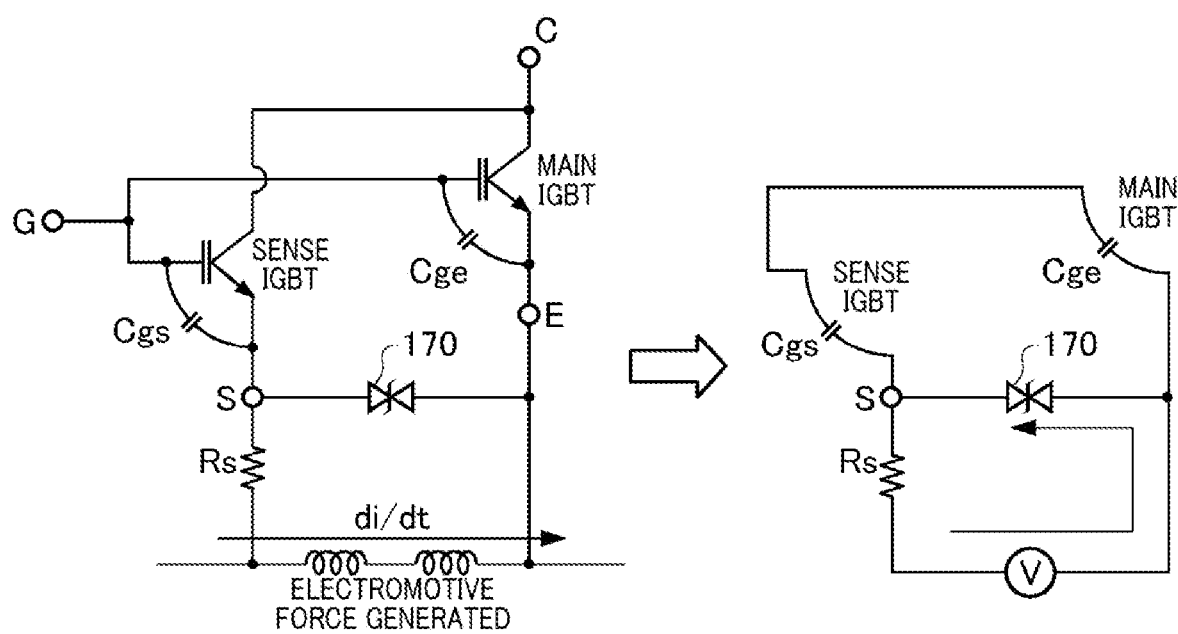
FIG. 3C shows an example of a circuit configuration of the semiconductor module 200 according to an embodiment example.

FIG. 3C shows an example of a circuit configuration of the semiconductor module 200 according to an embodiment example. In the semiconductor device of the present example, even in a case where overvoltage occurs in a circuit, it is possible to prevent the voltage from being concentrated at the G-S junction of the current sensing portion 141 due to the yielding of the Zener diode 170. In this way, the current sensing portion 141 is protected.

Figure 4:
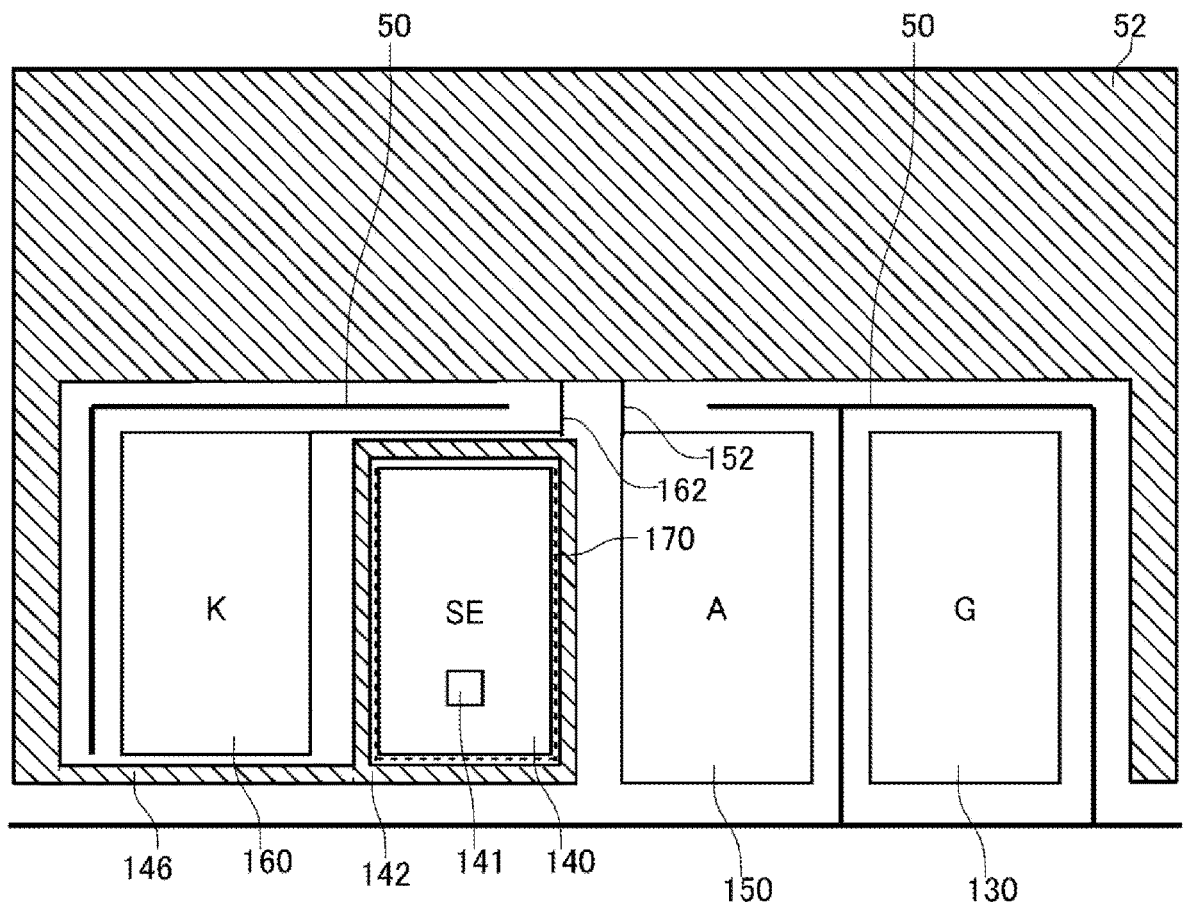
FIG. 4 shows an example of a configuration of the semiconductor device 100 according to a second embodiment example.

FIG. 4 shows an example of a configuration of the semiconductor device 100 according to a second embodiment example. The semiconductor device 100 of the present example includes an electrode connecting portion 146.

The electrode connecting portion 146 connects the emitter potential electrode 142 and the emitter electrode 52, above the semiconductor substrate 10. Due to this, the emitter potential electrode 142 is set to the emitter potential. The electrode connecting portion 146 may be formed of the same material as the emitter electrode 52 or the emitter potential electrode 142. The electrode connecting portion 146 may be formed using a process common to a front surface electrode such as the emitter electrode 52.

The electrode connecting portion 146 of the present example connects the emitter potential electrode 142 and the emitter electrode 52, farther outward from the chip than the cathode pad 160. The position of the electrode connecting portion 146 is not limited to the position of the present example. The gate metal layer 50 does not need to be provided in the region where the electrode connecting portion 146 is provided. The gate metal layer 50 that is severed by the electrode connecting portion 146 may be connected via the gate runner 48.

Figure 5A:
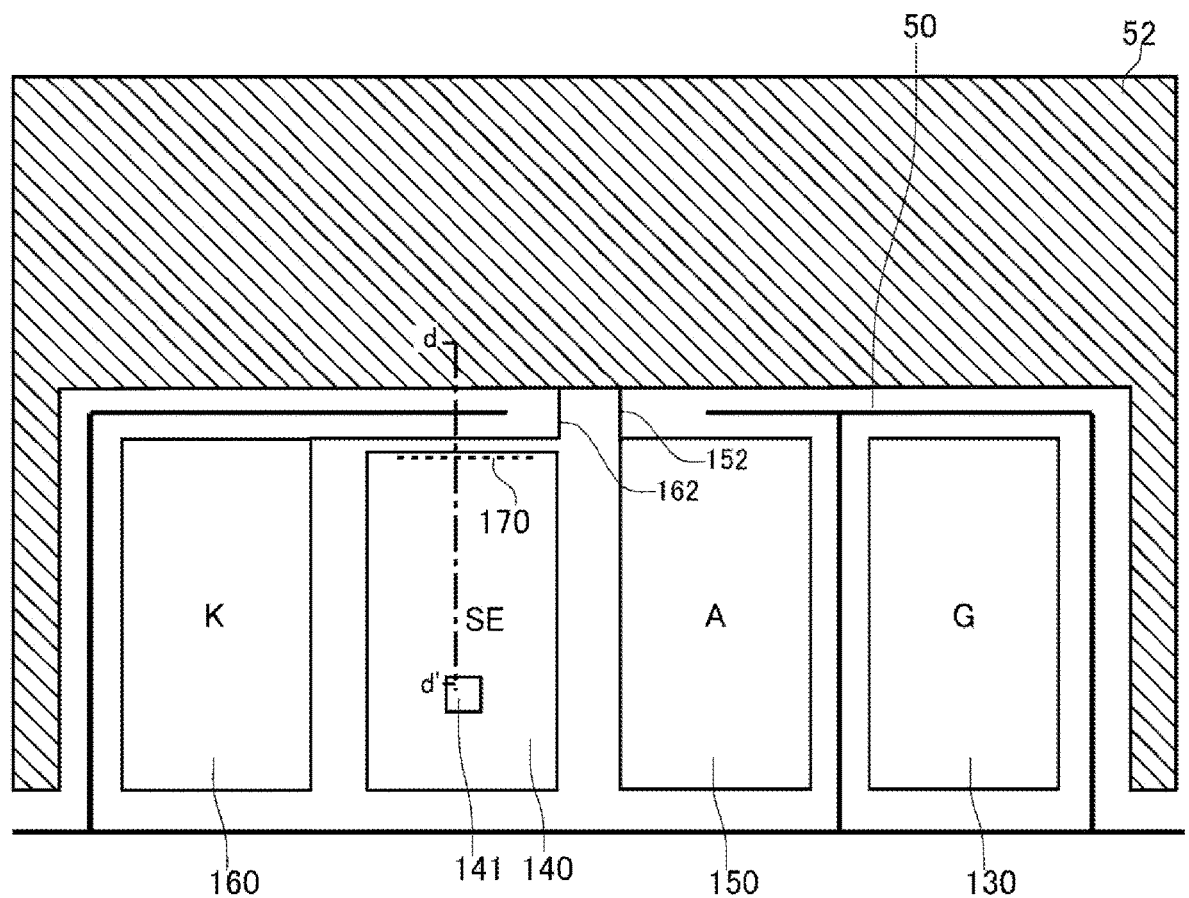
FIG. 5A shows an example of a top surface view of the semiconductor device 100 according to a third embodiment example.
Figure 5A:

FIG. 5A shows an example of a top surface view of the semiconductor device 100 according to a third embodiment example. The semiconductor device 100 of the present example includes the Zener diode 170 electrically connected to the emitter electrode 52 via the semiconductor substrate 10. The semiconductor device 100 of the present example differs from the first embodiment example and the second embodiment example by not including the emitter potential electrode 142.

In FIG. 5A, the Zener diode 170 is provided at the end portion of the sense electrode 140 on the positive Y-axis direction side, in the top surface view, but may be provided anywhere between the positive Y-axis direction side of the sense electrode 140 and the current sensing portion 141. The Zener diode 170 is provided extending in the X-axis direction in the top surface view. However, the shape of the Zener diode 170 is not limited to that of the present example. Essentially, as long as the Zener diode 170 is electrically connected between the emitter electrode 52 and the sense electrode 140, the shape and position of the Zener diode 170 are not particularly limited.

Figure 5B:
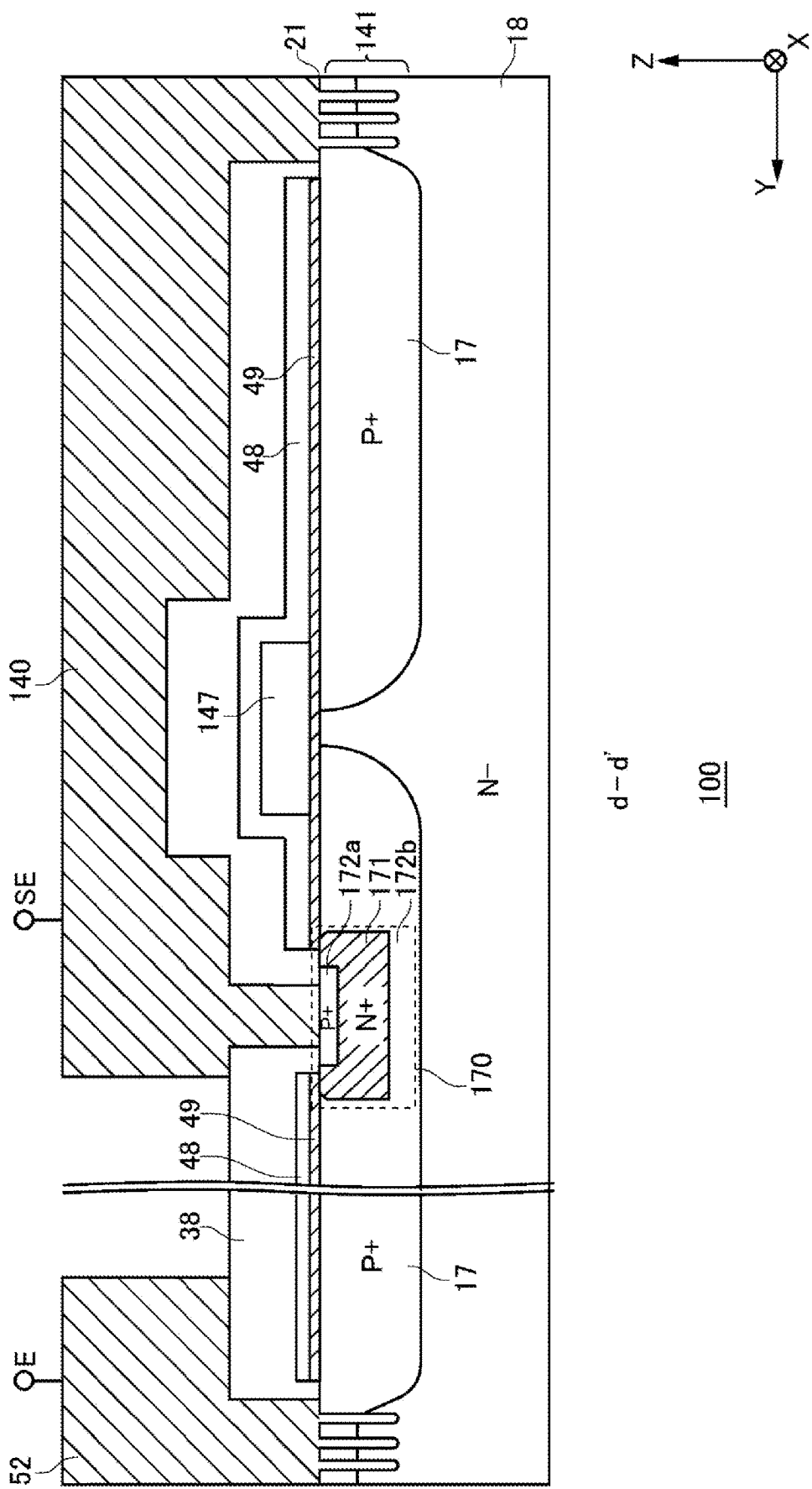
FIG. 5B shows an example of the d-d' cross section of FIG. 5A.

FIG. 5B shows an example of the d-d' cross section of FIG. 5A. The Zener diode 170 of the present example is formed by the first-conductivity-type region 171 and the second-conductivity-type region 172, which are formed in the depth direction. The second-conductivity-type region 172 includes the second-conductivity-type region 172a and the second-conductivity-type region 172b.

The first-conductivity-type region 171 is provided above the well region 17 in the semiconductor substrate 10. The first-conductivity-type region 171 of the present example is provided above the second-conductivity-type region 172b, which is the well region 17. The first-conductivity-type region 171 may be formed using a process common to the other regions of the first conductivity type. For example, the first-conductivity-type region 171 may be formed using a process common to the emitter region 12, and may have the same film thickness and doping concentration as the emitter region 12.

The second-conductivity-type region 172a is provided above the first-conductivity-type region 171 in the semiconductor substrate 10. The second-conductivity-type region 172a may be formed using a process common to the other regions of the second conductivity type. For example, the second-conductivity-type region 172a is formed using a process common to the contact plugs of the second conductivity type of the transistor portion 70.

The second-conductivity-type region 172b is provided below the first-conductivity-type region 171. The second-conductivity-type region 172b is at least a portion of the well region 17. The second-conductivity-type region 172b functions as a second-conductivity-type region of the Zener diode 170.

An oxide film 147 is provided above the front surface 21 between well regions 17. As an example, the film thickness of the oxide film 147 is less than or equal to 1 μm. The gate runner 48 may be provided on the top surface of the oxide film 147. The gate runner 48 may be provided extending below the sense electrode 140 and the emitter electrode 52. The gate runner 48 may be separated from the front surface electrodes by the interlayer dielectric film 38.

Figure 6:
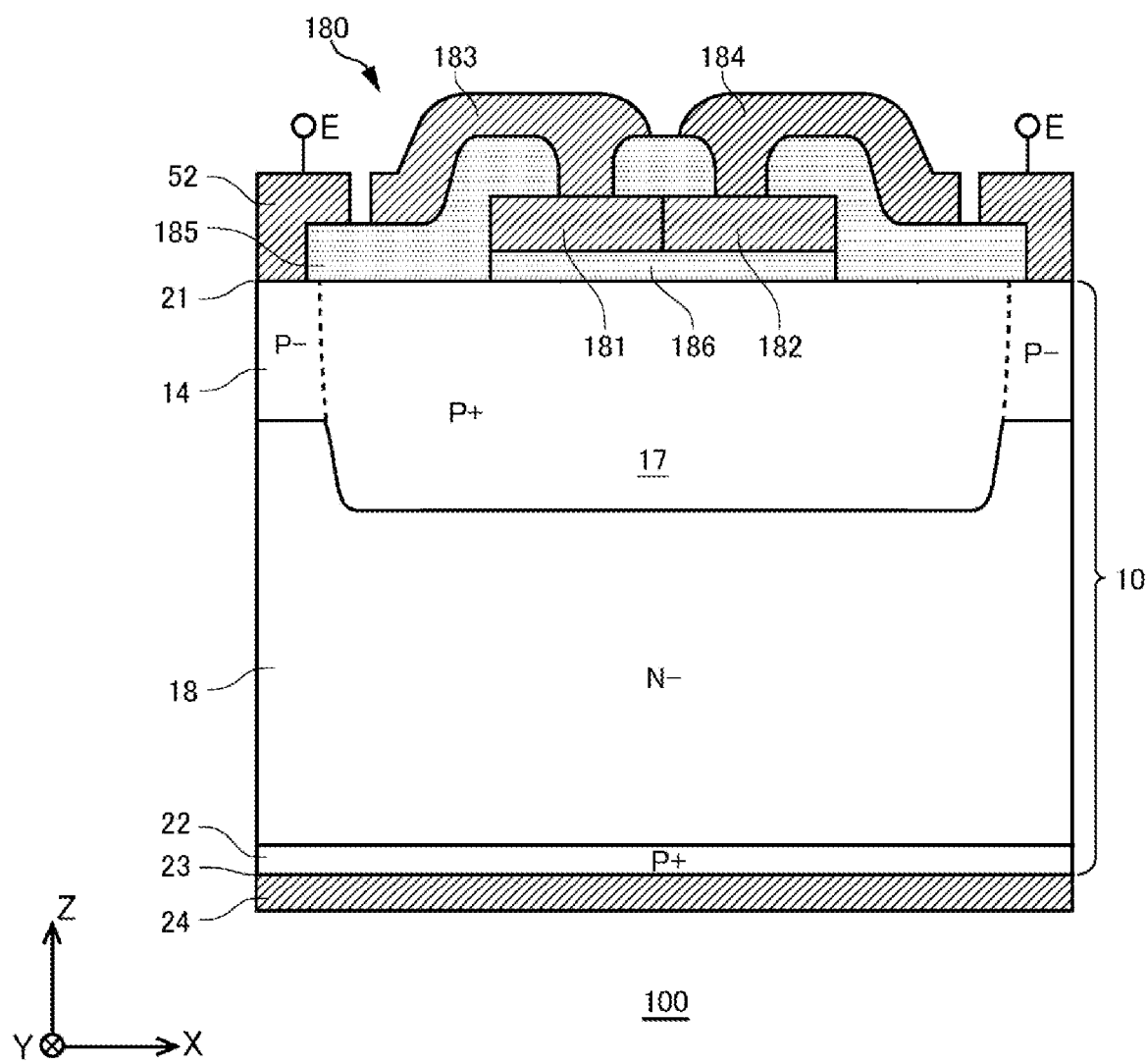
FIG. 6 shows an example of a cross section of the temperature sensing portion 180.

FIG. 6 shows an example of a cross section of the temperature sensing portion 180. In particular, FIG. 6 shows a cross section near the region where the temperature sensing portion 180 is formed.

The temperature sensing portion 180 includes a diode provided in the semiconductor substrate 10. The temperature sensing portion 180 detects the temperature of the semiconductor device 100, by utilizing the fact that the current-voltage characteristic of the diode changes according to the temperature. The temperature sensing portion 180 is arranged above the semiconductor substrate 10, with the interlayer dielectric film 186 interposed therebetween. Furthermore, the temperature sensing portion 180 is formed above the well region 17. The temperature sensing portion 180 of the present example includes a first-conductivity-type region 181, a second-conductivity-type region 182, a first connecting portion 183, a second connecting portion 184, and a interlayer dielectric film 185.

The first-conductivity-type region 181 and the second-conductivity-type region 182 form a PN diode. For example, the first-conductivity-type region 181 is formed by an N type semiconductor and functions as a cathode region. The second-conductivity-type region 182 may be formed by a P type semiconductor and function as an anode region. The first-conductivity-type region 181 and the second-conductivity-type region 182 are provided on an interlayer dielectric film 186.

The diode of the temperature sensing portion 180 and the Zener diode 170 may have substantially the same film thickness. That is, the film thicknesses of the first-conductivity-type region 181 and the second-conductivity-type region 182 may be the same as the film thicknesses of the first-conductivity-type region 171 and the second-conductivity-type region 172. The first-conductivity-type region 181 and the second-conductivity-type region 182 may be formed using a process common to the first-conductivity-type region 171 and the second-conductivity-type region 172.

The first connecting portion 183 is electrically connected to the first-conductivity-type region 181. The second connecting portion 184 is electrically connected to the second-conductivity-type region 182. The first connecting portion 183 is electrically connected to the cathode pad 160 by the cathode wire 162. The second connecting portion 184 is electrically connected to the anode pad 150 by the anode wire 152.

The interlayer dielectric film 185 is provided on the top surfaces of the first-conductivity-type region 181 and the second-conductivity-type region 182. Furthermore, the interlayer dielectric film 185 is provided on the top surface of the interlayer dielectric film 186. The interlayer dielectric film 185 includes a contact hole for electrically connecting the first connecting portion 183 to the first-conductivity-type region 181. The interlayer dielectric film 185 includes a contact hole for electrically connecting the second connecting portion 184 to the second-conductivity-type region 182.

The interlayer dielectric film 185 maybe formed using a process common to the interlayer dielectric film 38.

The temperature sensing portion 180 of the present example includes a well region 17 on the back surface 23 side of the corresponding semiconductor substrate 10. Element regions such as the transistor portion 70 and the diode portion 80 may be provided below the temperature sensing portion 180. The collector region 22 is provided below the temperature sensing portion 180 of the present example. In other words, the temperature sensing portion 180 is provided in the transistor portion 70. Also, the temperature sensing portion 180 may be provided in the diode portion 80.

Figure 7A:
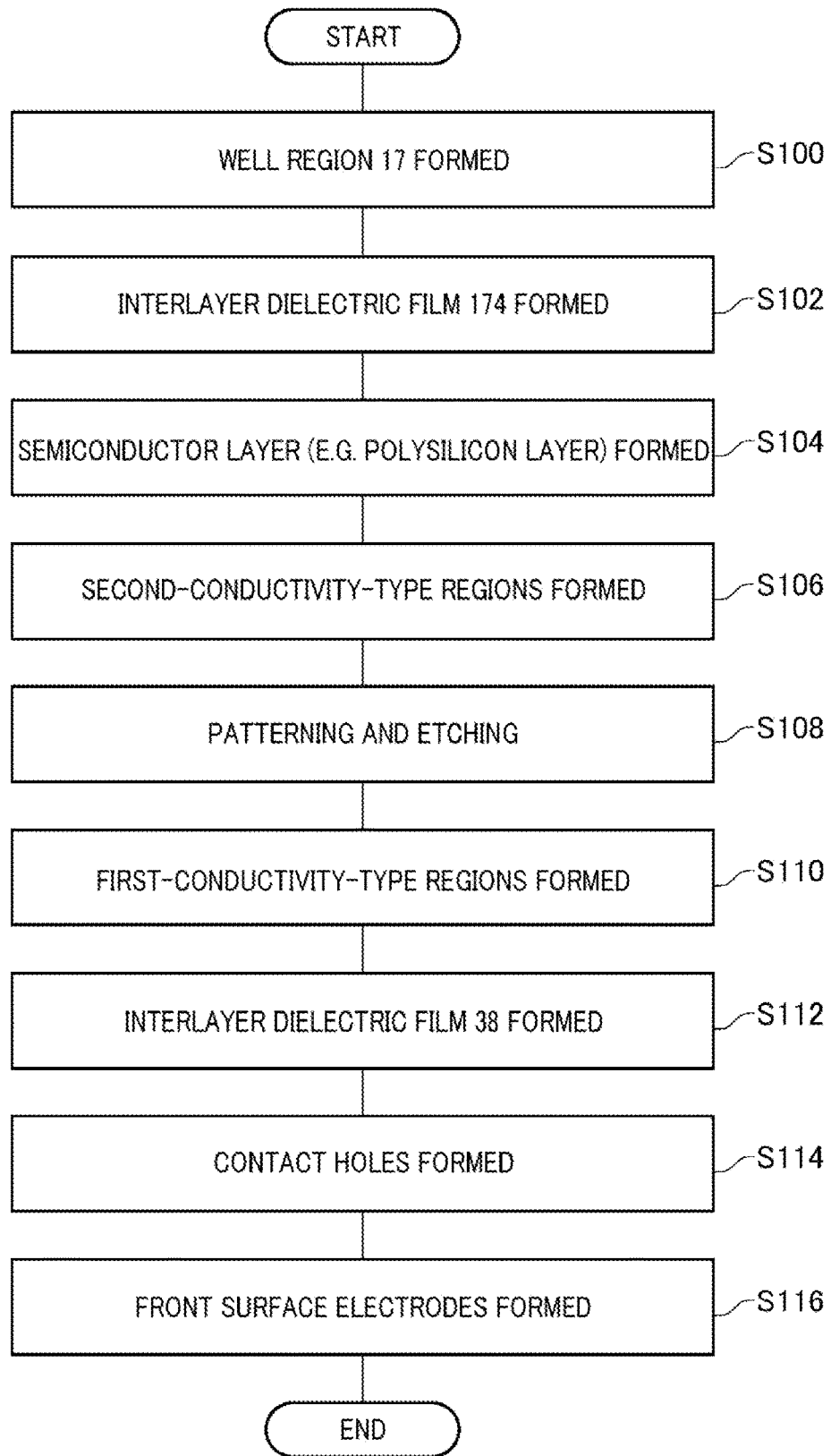
FIG. 7A is an example of a flow chart for fabricating the semiconductor device 100 according to the first embodiment example or the second embodiment example.

FIG. 7A is an example of a flow chart for fabricating the semiconductor device 100 according to the first embodiment example or the second embodiment example. At step S100, the well region 17 is formed. At step S102, the interlayer dielectric film 174 is formed. The interlayer dielectric film 174 may be provided on the entire surface of the semiconductor substrate 10. The interlayer dielectric film 186 of the temperature sensing portion 180 may be formed at the same time as the interlayer dielectric film 174.

At step S104, the semiconductor layer is formed. For example, the semiconductor layer is a polysilicon layer for forming the Zener diode 170 or the temperature sensing portion 180. The semiconductor layer may be formed on the entire surface of the semiconductor substrate 10. The PN structure of the Zener diode 170 may be formed using a process common to the PN structure of the diode of the temperature sensing portion 180. In other words, there is no need to provide a new step for the Zener diode 170.

At step S106, the second-conductivity-type regions are formed by injecting ions into the semiconductor substrate. The second-conductivity-type region 172 and the second-conductivity-type region 182 may be formed using a common process, as the second-conductivity-type regions. At step S108, necessary regions are left behind as the first-conductivity-type regions and the second-conductivity-type regions, using patterning or etching.

At step S110, the first-conductivity-type regions are formed by injecting ions into the semiconductor layer. The first-conductivity-type region 171 and the first-conductivity-type region 181 may be formed by a common process, as the first-conductivity-type regions. For example, the first-conductivity-type region 171 and the first-conductivity-type region 181 are formed by inverting the conductivity type of portions of the regions formed as the second-conductivity-type region 172 and the second-conductivity-type region 182 in step S106.

At step S112, the interlayer dielectric film 38 is formed. The interlayer dielectric film 185 of the temperature sensing portion 180 may be formed at the same time as the interlayer dielectric film 38. At step S114, the contact holes are formed in the interlayer dielectric film 38. The contact holes of the interlayer dielectric film 185 may be formed at the same time as the contact holes of the interlayer dielectric film 38. At step S116, the front surface electrodes are formed. At step S116, the contact portion 144 may be formed using a process common to the emitter potential electrode 142.

In the second embodiment example, at the stage of forming the contact holes of step S114, there is no need to form contact holes for providing the contact portion 144. On the other hand, at step S116, the electrode connecting portion 146 is formed using a process common to the emitter potential electrode 142 and the emitter electrode 52, at the same time as the formation of the front surface electrodes.

In the semiconductor device 100 fabricating method of the present example, by causing the step of forming the Zener diode 170 to be in common with other steps, it is possible to form the Zener diode 170 without providing a dedicated step. Accordingly, it is easy to add the Zener diode 170.

Figure 7B:
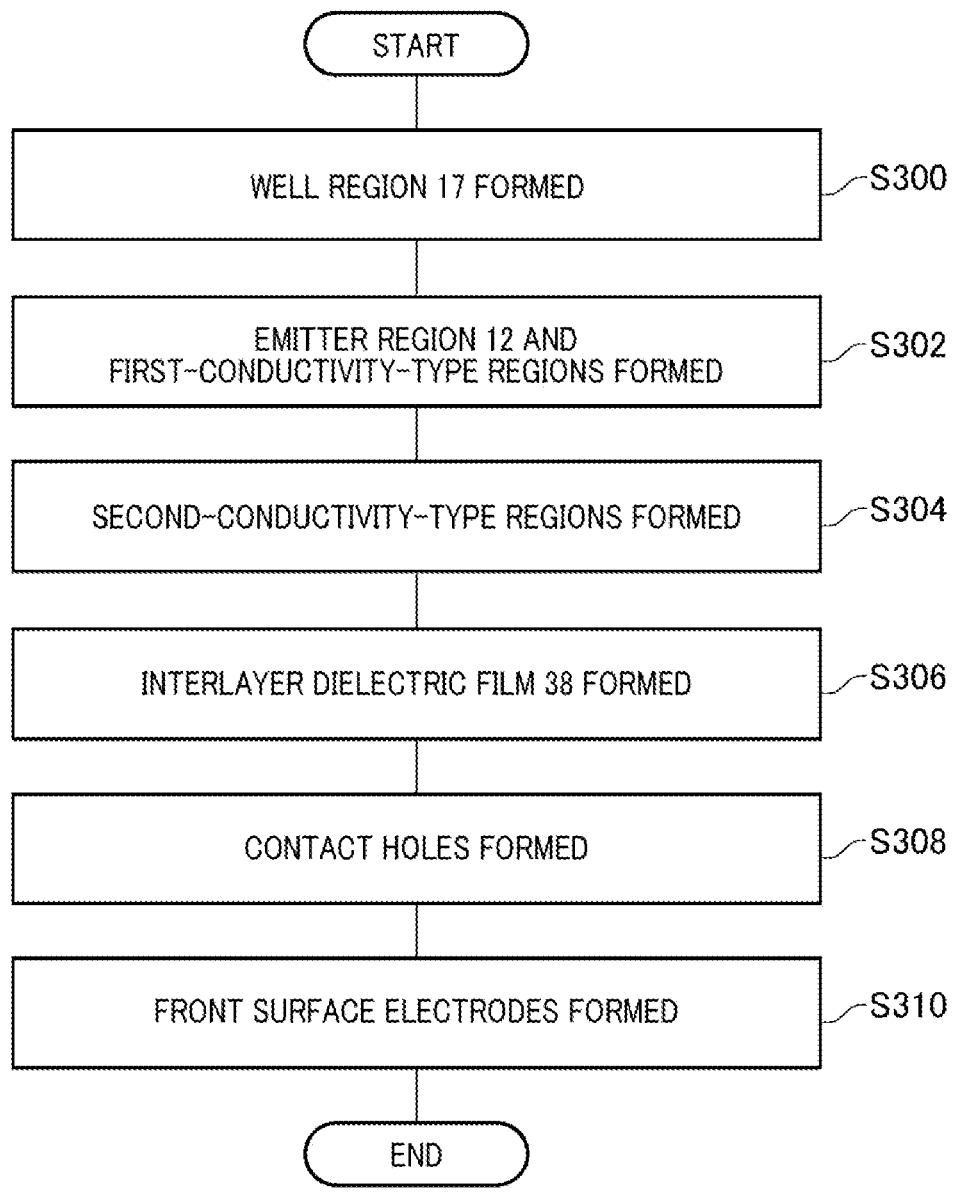
FIG. 7B is an example of a flow chart for fabricating the semiconductor device 100 according to the third embodiment example.

FIG. 7B is an example of a flow chart for fabricating the semiconductor device 100 according to the third embodiment example. At step S300, the well region 17 is formed. At step S302, the emitter region 12 and the first-conductivity-type regions are formed. The first-conductivity-type region 171 and the first-conductivity-type region 181 may be formed using a common process, as the first-conductivity-type regions. Furthermore, the first-conductivity-type region 171 may be formed using a process that is common to the emitter region 12 of the transistor portion 70.

At step S304, the second-conductivity-type regions are formed. The second-conductivity-type region 172 and the second-conductivity-type region 182 may be formed using a common process, as the second-conductivity-type regions. At step S306, the interlayer dielectric film 38 is formed. The interlayer dielectric film 185 of the temperature sensing portion 180 may be formed at the same time as the interlayer dielectric film 38.

At step S308, the contact holes are formed in the interlayer dielectric film 38. The contact holes of the interlayer dielectric film 185 may be formed at the same time as the contact holes of the interlayer dielectric film 38. At step S310, the front surface electrodes are formed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10. semiconductor substrate
12. emitter region
14. base region
15. contact region
16. accumulation region
17. well region
18. drift region
20. buffer region
21. front surface
22. collector region
23. back surface
24. collector electrode
25. connecting portion
30. dummy trench portion
31. extending portion
32. dummy insulating film
33. connecting portion
34. dummy conducting portion
38. interlayer dielectric film
40. gate trench portion
41. extending portion
42. gate insulating film
43. connecting portion
44. gate conducting portion
48. gate runner
49. gate oxide film
50. gate metal layer
52. emitter electrode
54. contact hole
55. contact hole
56. contact hole
58. contact hole
59. contact hole
70. transistor portion
71. mesa portion
80. diode portion
81. mesa portion
82. cathode region
90. boundary portion
91. mesa portion
100. semiconductor device
110. active region
120. peripheral region
130. gate pad
140. sense electrode
141. current sensing portion
142. emitter potential electrode
144. contact portion
146. electrode connecting portion
147. oxide film
150. anode pad
152. anode wire
160. cathode pad
162. cathode wire
170. Zener diode
171. first-conductivity-type region
172. second-conductivity-type region
174. interlayer dielectric film
180. temperature sensing portion
181. first-conductivity-type region
182. second-conductivity-type region
183. first connecting portion
184. second connecting portion
185. interlayer dielectric film
186. interlayer dielectric film
200. semiconductor module
210. DCB substrate
220. print substrate
230. copper base

What is claimed is:

1. A semiconductor device fabricating method comprising:
providing a transistor portion in a semiconductor substrate;
providing a current sensing portion for detecting current flowing through the transistor portion;
providing an emitter electrode set to an emitter potential of the transistor portion;
providing a sense electrode electrically connected to the current sensing portion;
providing a Zener diode electrically connected to the sense electrode;
providing an emitter potential electrode that is set to the emitter potential and electrically connected to the Zener diode such that the Zener diode is electrically connected between the emitter potential electrode and the sense electrode;

arranging for the emitter potential electrode to surround the sense electrode on all sides such that the emitter potential electrode defines an enclosed area and the sense electrode is located inside the enclosed area in plan view; and providing a cathode pad between the emitter potential electrode and the emitter electrode, wherein the sense electrode is provided between an anode pad and the cathode pad.

2. The semiconductor device fabricating method according to claim 1, wherein a PN structure of the Zener diode is formed by using a process common to a PN structure of a diode of a temperature sensing portion.

3. The semiconductor device fabricating method according to claim 1, comprising:

providing a well region of a second conductivity type that is provided in the semiconductor substrate and set to the emitter potential;

providing an interlayer dielectric film between the emitter potential electrode and the well region;

providing a contact hole in the interlayer dielectric film; and providing, in the contact hole, a contact portion that electrically connects the emitter potential electrode and the well region.

4. The semiconductor device fabricating method according to claim 2, comprising:

providing a well region of a second conductivity type that is provided in the semiconductor substrate and set to the emitter potential;

providing an interlayer dielectric film between the emitter potential electrode and the well region;

providing a contact hole in the interlayer dielectric film; and providing, in the contact hole, a contact portion that electrically connects the emitter potential electrode and the well region.

5. The semiconductor device fabricating method according to claim 1, comprising:

providing an electrode connecting portion connecting the emitter potential electrode and the emitter electrode, above the semiconductor substrate.

6. The semiconductor device fabricating method according to claim 2, comprising:

providing an electrode connecting portion connecting the emitter potential electrode and the emitter electrode, above the semiconductor substrate.

7. The semiconductor device fabricating method according to claim 3, comprising:

providing an electrode connecting portion connecting the emitter potential electrode and the emitter electrode, above the semiconductor substrate.

8. The semiconductor device fabricating method according to claim 4, comprising:

providing an electrode connecting portion connecting the emitter potential electrode and the emitter electrode, above the semiconductor substrate.

9. The semiconductor device fabricating method according to claim 1, wherein a region of a first conductivity type of the Zener diode is formed by using a process common to an emitter region of the first conductivity type of the transistor portion.

10. A semiconductor device fabricating method comprising:

providing a transistor portion in a semiconductor substrate;

providing a current sensing portion for detecting current flowing through the transistor portion;

providing an emitter electrode set to an emitter potential of the transistor portion;

providing a sense electrode electrically connected to the current sensing portion;

providing a Zener diode electrically connected to the sense electrode;

providing an emitter potential electrode that is set to the emitter potential and is electrically connected to the Zener diode such that the Zener diode is electrically connected between the emitter potential electrode and the sense electrode;

arranging for the emitter potential electrode to surround the sense electrode;

providing one or more of a gate pad and an anode pad between the emitter potential electrode and at least a portion of the emitter electrode;

providing a well region of a second conductivity type that is provided in the semiconductor substrate and set to the emitter potential;

providing an interlayer dielectric film between the emitter potential electrode and the well region;

providing a contact hole in the interlayer dielectric film; and providing, in the contact hole, a contact portion that electrically connects the emitter potential electrode and the well region in order to set the emitter potential electrode to the emitter potential.

11. The semiconductor device fabricating method according to claim 10, wherein the emitter potential electrode surrounds the sense electrode on all sides such that the emitter potential electrode defines an enclosed area and the sense electrode is located inside the enclosed area in plan view, a cathode pad is provided between the emitter potential electrode and the emitter electrode, and the sense electrode is provided between an anode pad and the cathode pad.

* * * * *